United States Patent
Klein et al.

(10) Patent No.: US 6,356,102 B1
(45) Date of Patent: Mar. 12, 2002

(54) INTEGRATED CIRCUIT OUTPUT BUFFERS HAVING CONTROL CIRCUITS THEREIN THAT UTILIZE OUTPUT SIGNAL FEEDBACK TO CONTROL PULL-UP AND PULL-DOWN TIME INTERVALS

(75) Inventors: David J. Klein, Duluth; Prashant Shamarao, Atlanta, both of GA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/613,916

(22) Filed: Jul. 11, 2000

Related U.S. Application Data

(63) Continuation-in-part of application No. 09/374,630, filed on Aug. 16, 1999, now Pat. No. 6,242,942, which is a continuation-in-part of application No. 09/191,141, filed on Nov. 13, 1998, now Pat. No. 6,091,260.

(51) Int. Cl.[7] ............................................... H03K 17/16
(52) U.S. Cl. .............................. 326/27; 326/83; 326/87
(58) Field of Search ............................ 326/26, 27, 83, 326/86, 87

(56) References Cited

U.S. PATENT DOCUMENTS

| | | | | |
|---|---|---|---|---|
| 4,731,553 A | * | 3/1988 | Van Lehn et al. ............ | 326/87 |
| 4,758,743 A | | 7/1988 | Dehganpour et al. ....... | 307/443 |
| 4,785,201 A | | 11/1988 | Martinez .................... | 307/443 |
| 4,797,579 A | | 1/1989 | Lewis ......................... | 307/443 |
| 4,825,099 A | | 4/1989 | Barton ........................ | 307/270 |
| 4,829,199 A | | 5/1989 | Prater ......................... | 307/443 |
| 4,857,863 A | | 8/1989 | Ganger et al. .............. | 330/264 |
| 4,862,018 A | | 8/1989 | Taylor et al. ............... | 307/443 |

(List continued on next page.)

OTHER PUBLICATIONS

Texas Instruments, "*High–Speed, Low Voltage Logic Family from Texas Instruments is First to Achieve Sub–Two Nanosecond Propagation Delay*", 1998, 2 pp.

Texas Instruments, "*SN74AVC16244 16–Bit Buffer/Driver With 3–State Outputs*", Sep. 1988.

(List continued on next page.)

*Primary Examiner*—Michael Tokar
*Assistant Examiner*—Don Phv Ve
(74) *Attorney, Agent, or Firm*—Myers, Bigel, Sibley & Sajovec

(57) ABSTRACT

Integrated circuit output buffers include primary and secondary pull-down transistors and an output signal line electrically coupled to a drain of the primary pull-down transistor and a drain of the secondary pull-down transistor. A preferred control circuit is also provided. The control circuit turns on the primary pull-down transistor during first and second consecutive portions of a pull-down time interval and uses a signal fed back from the output signal line to control the timing of when a gate of the secondary pull-down transistor is electrically connected to a drain of the secondary pull-down transistor during the first portion of the pull-down time interval and also control the timing of when the gate electrode of the secondary pull-down transistor is electrically connected to a source of the secondary pull-down transistor during the second portion of the pull-down time interval. A pull-down portion of the control circuit may include a gate pull-up transistor having a drain electrically connected to the drain of the secondary pull-down transistor and a source electrically connected to a gate of the secondary pull-down transistor, and a gate pull-down transistor having a drain electrically connected to the gate of the secondary pull-down transistor and a source electrically connected to a source of the secondary pull-down transistor. These gate pull-up and pull-down transistors can be utilized to selectively turn on the secondary pull-down transistor during a first leading portion of a pull-down time interval and then turn off the secondary pull-down transistor during a second trailing portion of the pull-down time interval.

38 Claims, 17 Drawing Sheets

U.S. PATENT DOCUMENTS

| | | | | |
|---|---|---|---|---|
| 4,906,867 A | 3/1990 | Petty | | 307/443 |
| 4,908,528 A | 3/1990 | Huang | | 307/443 |
| 4,924,115 A | 5/1990 | Yazdy | | 307/443 |
| 4,931,668 A | 6/1990 | Kikuda et al. | | 307/443 |
| 4,959,561 A | 9/1990 | McDermott et al. | | 307/443 |
| 4,973,861 A | 11/1990 | Dikken | | 307/443 |
| 4,983,860 A | 1/1991 | Yim et al. | | 307/443 |
| 5,013,940 A | 5/1991 | Ansel | | 307/473 |
| 5,028,818 A | 7/1991 | Go Ang et al. | | 307/443 |
| 5,063,308 A | 11/1991 | Borkar | | 307/443 |
| 5,081,374 A | 1/1992 | Davis | | 307/451 |
| 5,097,149 A | 3/1992 | Lee | | 307/443 |
| 5,111,064 A | 5/1992 | Ward | | 307/270 |
| 5,122,690 A | * 6/1992 | Bianchi | | 326/87 |
| 5,149,991 A | 9/1992 | Rogers | | 307/443 |
| 5,166,555 A | 11/1992 | Kano | | 307/451 |
| 5,216,291 A | 6/1993 | Seevinck et al. | | 307/296.6 |
| 5,237,213 A | 8/1993 | Tanoi | | 307/290 |
| 5,241,221 A | 8/1993 | Fletcher et al. | | 307/263 |
| 5,253,205 A | 10/1993 | Eaton, Jr. | | 365/189.06 |
| 5,291,443 A | 3/1994 | Lim | | 365/189.04 |
| 5,319,252 A | 6/1994 | Pierce et al. | | 307/263 |
| 5,319,258 A | 6/1994 | Ruetz | | 307/443 |
| 5,319,260 A | 6/1994 | Wanlass | | 307/443 |
| 5,347,177 A | 9/1994 | Lipp | | 307/443 |
| 5,352,939 A | 10/1994 | Hirabayashi et al. | | 307/443 |
| 5,367,481 A | 11/1994 | Takase et al. | | 365/149 |
| 5,414,379 A | 5/1995 | Kwon | | 327/170 |
| 5,416,743 A | 5/1995 | Allan et al. | | 365/203 |
| 5,418,739 A | 5/1995 | Takasugi | | 365/149 |
| 5,426,376 A | 6/1995 | Wong et al. | | 326/27 |
| 5,430,404 A | 7/1995 | Campbell et al. | | 327/566 |
| 5,432,471 A | 7/1995 | Majumdar et al. | | 327/380 |
| 5,438,277 A | 8/1995 | Sharpe-Geisler | | 326/27 |
| 5,451,861 A | 9/1995 | Giebel | | 323/315 |
| 5,483,177 A | 1/1996 | Van Lieverloo | | 326/27 |
| 5,489,861 A | 2/1996 | Seymour | | 327/108 |
| 5,517,142 A | 5/1996 | Jang et al. | | 327/108 |
| 5,534,790 A | 7/1996 | Huynh et al. | | 326/27 |
| 5,537,060 A | 7/1996 | Baek | | 326/87 |
| 5,546,033 A | 8/1996 | Campbell et al. | | 327/170 |
| 5,559,447 A | 9/1996 | Rees | | 326/30 |
| 5,568,081 A | 10/1996 | Lui et al. | | 327/380 |
| 5,570,044 A | 10/1996 | Martin et al. | | 326/84 |
| 5,604,453 A | 2/1997 | Pedersen | | 327/112 |
| 5,656,960 A | 8/1997 | Holzer | | 327/170 |
| 5,717,343 A | * 2/1998 | Kwong | | 326/83 |
| 5,786,709 A | 7/1998 | Kirsch et al. | | 326/27 |
| 5,828,260 A | 10/1998 | Taniguchi et al. | | 327/387 |
| 5,838,177 A | 11/1998 | Keeth | | 327/108 |
| 5,843,813 A | 12/1998 | Wei et al. | | 438/200 |
| 5,877,647 A | 3/1999 | Vajapey et al. | | 327/391 |
| 5,887,150 A | 3/1999 | Schneider et al. | | 395/306 |
| 5,894,238 A | 4/1999 | Chien | | 327/112 |
| 5,900,770 A | 5/1999 | Sabin | | 327/519 |
| 5,910,874 A | 6/1999 | Iniewski et al. | | 361/56 |
| 5,977,790 A | 11/1999 | Sanwo et al. | | 326/27 |
| 6,014,046 A | 1/2000 | Douse et al. | | 327/112 |

OTHER PUBLICATIONS

Texas Instruments, *"Dynamic Output Control (DOC™) Circuitry Technology and Applications"*, Aug. 1998.

Texas Instruments, *"AVC Logic Family Technology and Applications"*, Aug. 1998.

Furutani et al., *An Adjustable Output Driver With a Self-–Recovering VPP Generator for a 4Mx16 DRAM*, IEEE Journal of Solid–State Circuits, vol. 29, No. 3, Mar. 1994, pp. 308–310.

Senthinathan et al., *Application Specific CMOS Output Driver Circuit Design Techniques to Reduce Simultaneous Switching Noise*, IEEE Journal of Solid–State Circuits, vol. 28, No. 12, Dec. 1993, pp. 1383–1388.

Miyaji et al., *A 25–ns 4–Mbit CMOS SRAM With Dynamic Bit–Line Loads* IEEE Journal of Solid–State Circuits, vol. 24, No. 5, Oct. 1989, ppl 1213–1218.

* cited by examiner

INTEGRATED CIRCUIT OUTPUT BUFFERS HAVING CONTROL CIRCUITS THEREIN THAT UTILIZE OUTPUT SIGNAL FEEDBACK TO CONTROL PULL-UP AND PULL-DOWN TIME INTERVALS

CROSS-REFERENCE TO RELATED APPLICATION

This application is a continuation-in-part (CIP) of U.S. application Ser. No. 09/374,630, filed Aug. 16, 1999, now U.S. Pat. No. 6,242,942, which is a continuation-in-part (CIP) of U.S. application Ser. No. 09/191,141, filed Nov. 13, 1998, now U.S. Pat. No. 6,091,260, assigned to the present assignee, the disclosures of which are hereby incorporated herein by reference.

FIELD OF THE INVENTION

The present invention relates to integrated circuit devices, and more particularly to integrated circuit output buffers.

BACKGROUND OF THE INVENTION

Integrated circuits typically include buffer circuits therein for driving on-chip and off-chip loads. Dynamic output control (DOC) can also be provided by output buffers, such as those disclosed in application notes by Texas Instruments, Inc. (see, http://www.ti.com/sc/AVC). In particular, these output buffers having DOC circuitry may provide variable output impedance to reduce signal noise during output transitions. In these buffers, the DOC circuitry is stated as providing enough current to achieve high signaling speeds, while also having the ability to quickly switch the impedance level to reduce the undershoot and overshoot noise that is often found in high-speed logic. Such DOC circuitry may be used advantageously to eliminate the need for damping resistors which can limit noise but typically also increase propagation delay.

Additional buffer circuits are also disclosed in U.S. Pat. No. 5,894,238 to Chien, entitled "Output Buffer With Static and Transient Pull-Up and Pull-Down Drivers". In particular, the '238 patent discloses an inverting buffer circuit that utilizes a signal fed back from an output node (DOUT) through logic gates to control the transfer of data input signals (OL or /OH) to inputs of a transient driver circuit containing an NMOS pull-down transistor 22 and a PMOS pull-up transistor 12.

Notwithstanding such conventional output buffers with DOC circuitry, however, there still exists a need for output buffers that have excellent noise, propagation delay and impedance matching characteristics.

SUMMARY OF THE INVENTION

It is therefore an object of the present invention to provide improved integrated circuit output buffers.

It is another object of the present invention to provide integrated circuit output buffers having low propagation delay.

It is still another object of the present invention to provide integrated circuit output buffers having improved simultaneous-switching noise characteristics.

It is yet another object of the present invention to provide integrated circuit output buffers having reduced supply line-to-output coupling and improved impedance matching characteristics during DC operation.

These and other objects, advantages and features of the present invention may be provided by integrated circuit output buffers having pull-down and pull-up circuits and a control circuit that utilizes a preferred feedback technique that may facilitate a reduction in simultaneous-switching noise during pull-down and pull-up operations and may also improve the impedance matching characteristics of the output buffers during DC conditions. The preferred feedback technique may also limit the degree to which external noise can influence operation of the control circuit. Each of the pull-down and pull-up circuits may be provided by a respective pair of primary and secondary transistors.

In particular, a preferred pull-down circuit is configured so that the primary and secondary pull-down transistors (e.g., NMOS transistors) are electrically coupled to an output signal line (through an ESD protection resistor) and to a first reference signal line (e.g., Vss). The control circuit is designed to activate the pull-down circuit by turning on both the primary and secondary pull-down transistors during a leading portion of the pull-down time interval and by turning off the secondary pull-down transistor during a trailing portion of the pull-down time interval using a first feedback switch that is electrically coupled in series between the output signal line and a gate electrode of the secondary pull-down transistor so that a signal representing a potential of the output signal line can be passed through the first feedback switch to the gate electrode of the secondary pull-down transistor. In contrast, the pull-up circuit is preferably configured so that the primary and secondary pull-up transistors (e.g., PMOS transistors) are electrically coupled to an output signal line and to a second reference signal line (e.g., Vdd). Here, the control circuit is designed to activate the pull-up circuit by turning on both the primary and secondary pull-up transistors during a leading portion of the pull-up time interval and by turning off the secondary pull-up transistor during a trailing portion of the pull-up time interval using a second feedback switch that is electrically coupled in series between the output signal line and a gate electrode of the secondary pull-up transistor.

The control circuit also includes circuitry therein that is responsive to a data input signal (DI) and an output enable signal (OE). The control circuit controls tri-state operation of the output buffer, turns on the first feedback switch when the boolean expression OE∧$\overline{DI}$=1 (where "∧" represents a boolean AND operation), and turns on the second feedback switch when the boolean expression OE∧DI=1. The control circuit may also comprise an NMOS pull-down transistor electrically connected in series (source-to-drain) between the gate electrode of the secondary pull-down transistor and the first reference signal line and a PMOS pull-up transistor electrically connected in series between the gate electrode of the secondary pull-up transistor and the second reference signal line. To operate these pull-down and pull-up transistors, the control circuit includes circuitry therein that turns on the NMOS pull-down transistor when the boolean expression OE∧$\overline{DI}$=0 and turns on the PMOS pull-up transistor when the boolean expression OE∧DI=0.

According to additional preferred embodiments of the present invention, an integrated circuit output buffer comprises primary and secondary pull-down transistors and an output signal line electrically coupled to a drain of the primary pull-down transistor and a drain of the secondary pull-down transistor. A preferred control circuit is also provided. This control circuit turns on the primary pull-down transistor during first and second consecutive portions of a pull-down time interval and uses a signal fed back from the output signal line to control the timing of when a gate of the secondary pull-down transistor is electrically connected to a drain of the secondary pull-down transistor during the first portion of the pull-down time interval and also control the timing of when the gate electrode of the secondary pull-down transistor is electrically connected to a source of the secondary pull-down transistor during the second portion of the pull-down time interval.

According to these embodiments, a pull-down portion of the control circuit may include a gate pull-up transistor having a drain electrically connected to the drain of the secondary pull-down transistor and a source electrically connected to a gate of the secondary pull-down transistor, and a gate pull-down transistor having a drain electrically connected to the gate of the secondary pull-down transistor and a source electrically connected to a source of the secondary pull-down transistor. These gate pull-up and pull-down transistors can be utilized to selectively turn on the secondary pull-down transistor during a first leading portion of a pull-down time interval and then turn off the secondary pull-down transistor during a second trailing portion of the pull-down time interval. A gate control inverter is also provided having an input electrically coupled to a gate of the gate pull-up transistor and an output electrically coupled to a gate of the gate pull-down transistor. The control circuit also preferably includes a feedback inverter having an input electrically coupled to the output signal line, and a first logic gate (e.g., NOR gate) having a first input electrically coupled to an output of the feedback inverter and an output electrically coupled to the input of the gate control inverter.

In another preferred embodiment, the control circuit is responsive to an input signal (IN) and an output signal (OUT) fed back from the output signal line and includes logic devices therein that provide a gate of the primary pull-down transistor with a first gate signal that tracks $\overline{IN}$, and a gate of at least one of the gate pull-up transistor and the gate pull-down transistor with a second gate signal that is a function of $\overline{IN}{\wedge}OUT$. Alternatively, the control circuit may include logic devices therein that provide a gate of the primary pull-down transistor with a first gate signal that tracks IN, and a gate of at least one of the gate pull-up transistor and the gate pull-down transistor with a second gate signal that is a function of $IN{\wedge}OUT$. Preferably, the second gate signal is provided to the gate of the gate pull-up transistor. The control circuit may also provide the gate of the gate pull-down transistor with a third gate signal that is an inverted version of the second gate signal. The control circuit may also be responsive to an output enable signal (OE) and, if so, the control circuit preferably provides a gate of the primary pull-down transistor with a first gate signal that tracks $\overline{IN}$ only when OE is in a first logic state. The second gate signal may also be a function of $\overline{IN}{\wedge}OUT{\wedge}OE$. Related primary and secondary pull-up transistors and control circuitry may also used in the pull-up path to control pull-up of the output signal line in similar manner.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
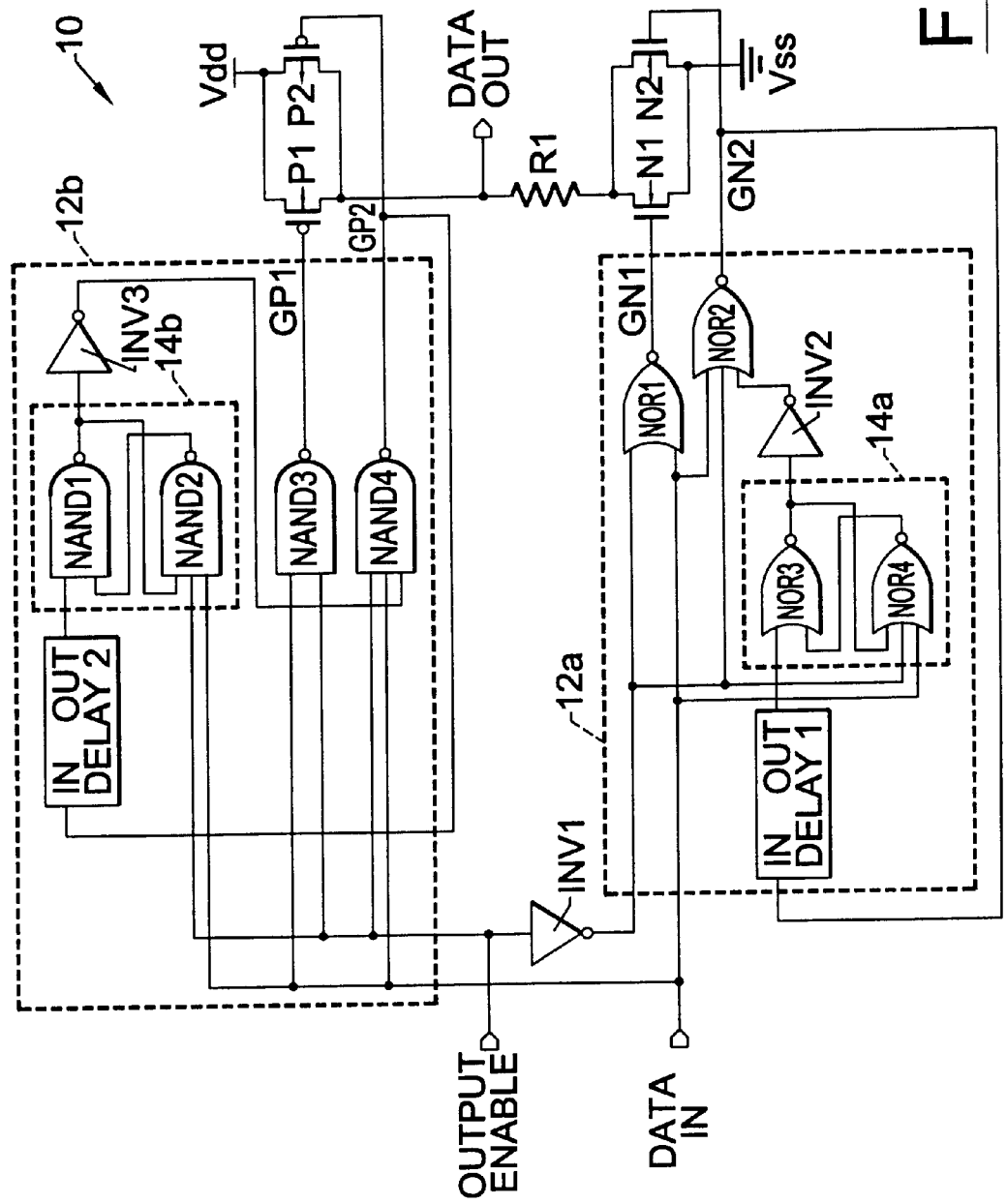
FIG. 1 is an electrical schematic of an integrate circuit output buffer according to a first embodiment of the present invention.
Figure 2:
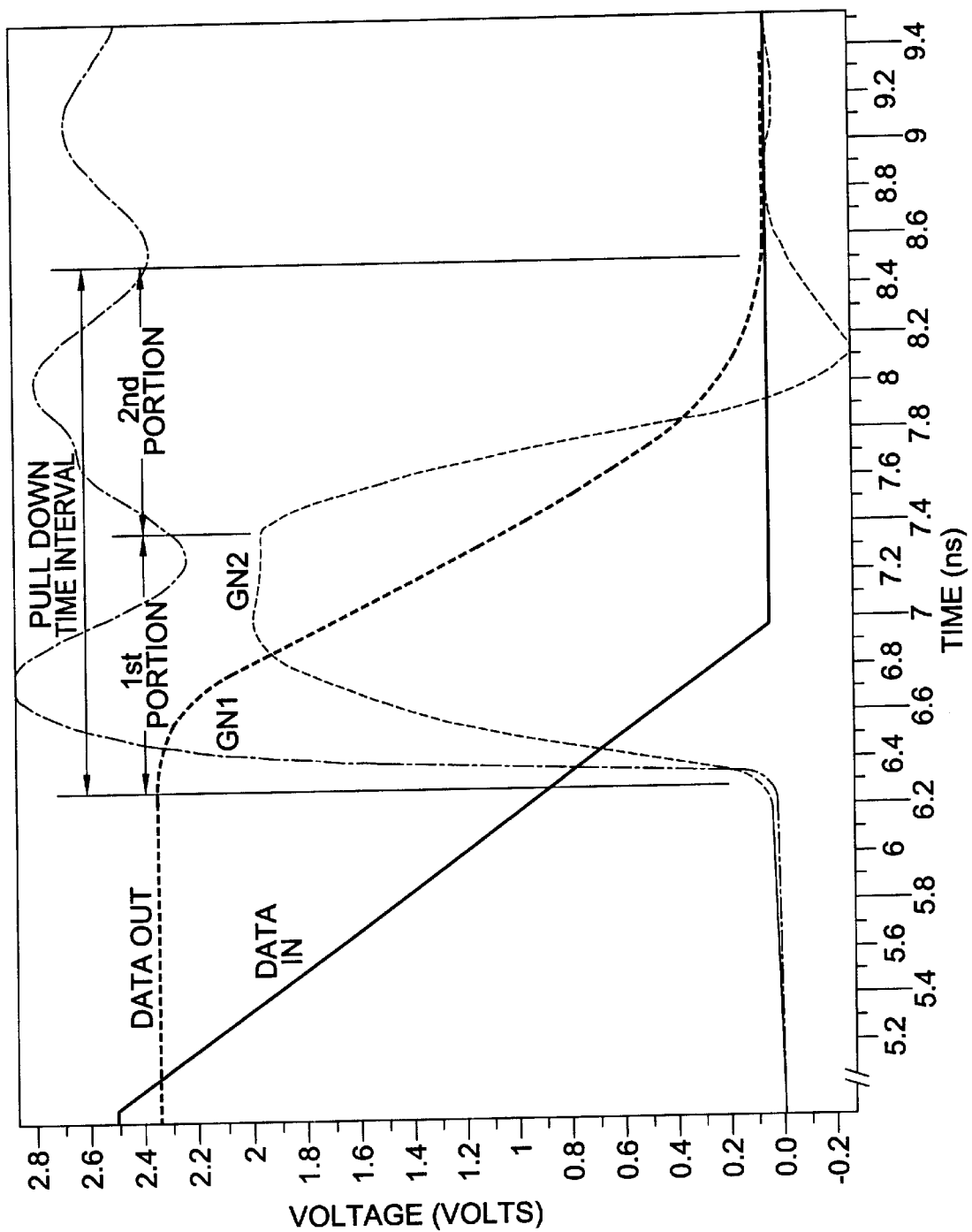
FIG. 2 is a timing diagram which illustrates the operation of the output buffer of FIG. 1.

Referring now to FIGS. 1–2, an integrated circuit output buffer 10 according to a first embodiment of the present invention passes an input signal (DATA IN) as an output signal (DATA OUT) with low propagation delay when the buffer 10 is enabled (i.e., OUTPUT ENABLE=1) and generates a high impedance output state when the buffer is disabled (OUTPUT ENABLE=0). The preferred buffer 10 includes first and second pull-down switches that are electrically connected in parallel. As illustrated, the first and second pull-down switches may comprise NMOS pull-down transistors N1 and N2. These pull-down transistors each have first terminals (drain electrodes) that are electrically connected to an output signal line (DATA OUT) by a resistor R1. This resistor R1 provides electrostatic discharge (ESD) protection and may have a value of about 10Ω, for example. The second terminals (i.e., source electrodes) of the pull-down transistors N1 and N2 are also electrically connected to a first reference signal line (e.g., Vss≦Gnd). A pull-down control circuit 12a is also provided to control the turn-on and turn-off of the pull-down transistors N1 and N2 in a preferred manner to reduce simultaneous-switching noise by reducing the degree of coupling between the output signal line (DATA OUT) and the first reference signal line Vss at the end of each pull-down transition. The preferred pull-down control circuit 12a can also be operated in a preferred manner to match the impedance of the pull-down path to the impedance of the load being driven by the output buffer.

To illustrate this preferred pull-down method, a quiescent DC condition can be initially established with the input signal line (DATA IN) set to a logic 1 level (while OUTPUT ENABLE=1). Once this condition has been established, the outputs of inverters INV1 and INV2, the outputs of the multi-input logic gates NOR1, NOR2 and NOR4 and the output of the first delay device (DELAY 1) will all be set to logic 0 levels and the output of the multi-input logic gate NOR3 will be set to a logic 1 level. Here, the multi-input logic gates NOR3 and NOR4 are configured as a first multi-input latch 14a.

If the input signal line (DATA IN) then transitions from 1→0, the pull-down control circuit 12a will initially turn on both of the NMOS pull-down transistors N1 and N2 during a first portion of a pull-down time interval by driving signal lines GN1 and GN2 from 0→1, as illustrated by FIG. 2. In particular, once the input signal line (DATA IN) initially transitions to a logic 0 level (with OUTPUT ENABLE=1), all the inputs to the multi-input logic gates NOR1 and NOR2 will be set to logic 0 levels and the outputs of the pull-down control circuit 12a (i.e., signal lines GN1 and GN2) will be set to logic 1 levels. This action by the pull-down control circuit 12a results in the formation of a low resistance pull-down path between the output signal line (DATA OUT) and the first reference signal line Vss. The value of this low resistance path during the first portion of the pull-down time interval is equal to the sum of the resistance of resistor R1 and the on-state resistance of the parallel combination of transistors N1 and N2 (which may have different respective on-state resistances). The value of resistor R1 and the widths of transistors N1 and N2 can also be chosen to obtain desired propagation delay characteristics during the first portion of the pull-down time interval (e.g., to obtain fast initial pull-down of the output signal line (DATA OUT)).

The preferred pull-down control circuit 12a also provides smooth monotonic pull-down of the output signal line (DATA OUT) and reduces simultaneous-switching noise by turning off transistor N2 during a second portion of the pull-down time interval by driving signal line GN2 from 1→0, as illustrated by FIG. 2. For purposes of illustration herein, transistor N2 is "turned off" when its gate voltage is below its threshold voltage. This action by the pull-down control circuit 12a increases the effective resistance of the pull-down path between the output signal line (DATA OUT) and the first reference signal line Vss and thereby reduces the degree of electrical coupling between these signal lines during the latter portion of the pull-down time interval. The output signal line (DATA OUT) can, therefore, be made less susceptible to noise caused by "ground bounce" fluctuations on the first reference signal line Vss. In addition, the size of the NMOS pull-down transistor N1 can be independently optimized to obtain excellent impedance matching during DC conditions.

This advantageous function of the pull-down control circuit 12a is preferably achieved by feeding back the control signal on the gate line GN2 directly as an input of the pull-down control circuit 12a. The 0→1 transition on this fed back input is then delayed using a first delay device DELAY 1 which provides a predetermined delay (e.g., ~1–1.5 ns). As illustrated by FIG. 2, if the delay provided by the first delay device DELAY 1 is of sufficient duration, the timing of the commencement of the second portion of the pull-down time interval (i.e., when signal line GN2 starts to transition back from 1→0) can be made to occur after the output signal line (DATA OUT) has transitioned below a threshold logic 0 level for purposes of switching devices having inputs electrically connected to the output signal line (i.e., $V_{DATAOUT} \leq V_{IL}$, where $V_{IL}$ is defined as the maximum input voltage that will be unambiguously recognized as a logic 0 signal by a device being driven by the output signal line).

Based on this preferred aspect of the pull-down control circuit 12a, the initial 0→1 transition of signal line GN2 during the first portion of the pull-down time interval will translate into a delayed 0→1 transition at an input of the first latch 14a. This 0→1 transition will then cause the output of the multi-input logic gate NOR3 to transition from 1→0 and the output of inverter INV2 to transition from 0→1. In response to these transitions, the output of the multi-input logic gate NOR2 will switch from 1→0 at the commencement of the second portion of the pull-down time interval, to turn-off NMOS pull-down transistor N2 and thereby increase the effective resistance of the pull-down path after the voltage on the output signal line (DATA OUT) has dropped below VIL. This increase in the resistance of the pull-down path lessens the degree to which ground bounce fluctuations will be represented as noise on the output signal line (DATA OUT). Notwithstanding this increase in resistance of the pull-down path during the second portion of the pull-down time interval, the use of direct feedback from the gate electrode of NMOS pull-down transistor N2 to the input of the first delay unit DELAY 1 facilitates smooth monotonic pull-down of the output signal line during the entire pull-down time interval. The use of the first latch 14a also precludes the fed back input from oscillating.

Referring again to FIG. 1, the preferred buffer 10 may also include first and second pull-up switches that are electrically connected in parallel. These first and second pull-up switches may be provided as PMOS pull-up transistors P1 and P2, connected as illustrated. A pull-up control circuit 12b is also provided to control the turn-on and turn-off of the pull-up transistors P1 and P2 in a preferred manner to reduce simultaneous-switching noise by reducing the degree of coupling between the output signal line (DATA OUT) and the second reference signal line Vdd at the end of each pull-up transition. Preferred impedance matching characteristics may also be achieved. For example, a quiescent DC condition can be initially established with the input signal line (DATA IN) set to a logic 0 level (while OUTPUT ENABLE=1). Once this condition has been established, the outputs of inverter INV3, the outputs of the multi-input logic gates NAND2, NAND3 and NAND4 and the output of the second delay device (DELAY 2) will all be set to logic 1 levels and the output of the multi-input logic gate NAND1 will be set to a logic 0 level. Here, the multi-input logic gates NAND1 and NAND2 are configured as a second multi-input latch 14b.

If the input signal line (DATA IN) then transitions from 0→1, the pull-up control circuit 12b will initially turn on both of the PMOS pull-up transistors P1 and P2 during a first portion of a pull-up time interval by driving control signal lines GP1 and GP2 from 1→0. Once the input signal line (DATA IN) initially transitions to a logic 1 level (with OUTPUT ENABLE=1), all the inputs to the multi-input logic gates NAND1 and NAND2 will be set to logic 1 levels and the outputs of the pull-up control circuit 12b (i.e., signal lines GP1 and GP2) will be set to logic 0 levels. This action by the pull-up control circuit 12b results in the formation of a low resistance pull-up path between the output signal line (DATA OUT) and the second reference signal line Vdd. The value of this low resistance path during the first portion of the pull-up time interval is equivalent to the on-state resistance of the parallel combination of PMOS transistors P1 and P2. Here, the on-state resistance of each of the PMOS transistors P1 and P2 may be chosen to obtain desired propagation delay characteristics during the first portion of the pull-up time interval (e.g., to obtain fast initial pull-up) and desired impedance matching characteristics at the completion of the pull-up time interval.

The preferred pull-up control circuit 12b also provides smooth monotonic pull-up of the output signal line (DATA OUT) and reduces simultaneous-switching noise by turning off PMOS pull-up transistor P2 during a second portion of the pull-up time interval by driving signal line P2 from 0→1. This action by the pull-up control circuit 12b increases the effective resistance of the pull-up path between the output signal line (DATA OUT) and the second reference signal line Vdd and thereby reduces the degree of electrical coupling between these signal lines during the latter portion of the pull-up time interval. The output signal line (DATA OUT) can, therefore, be made less susceptible to noise caused by "supply/Vdd bounce" fluctuations on the second reference signal line Vdd.

As illustrated by FIG. 1, this advantageous function of the pull-up control circuit 12b is preferably achieved by feeding back signal line GP2 directly as an input of the pull-up control circuit 12b. The 1→0 transition on this fed back input is then delayed using a second delay device DELAY 2 which provides a predetermined delay (e.g., ~1→1.5 ns). Like the above discussion provided with respect to FIG. 2, if the delay provided by the delay device DELAY 2 is of sufficient duration, the timing of the commencement of the second portion of the pull-up time interval (i.e., when signal line GP2 starts to transition back from 0→1 ) can be made to occur after the output signal line (DATA OUT) has transitioned above a threshold logic 1 level for purposes of switching devices having inputs electrically connected to the output signal line (i.e., $V_{DATA\ OUT} \geq V_{IH}$, where $V_{IH}$ is defined as the minimum input voltage that will be unambiguously recognized as a logic 1 signal by a device being driven by the output signal line).

Based on this preferred aspect of the pull-up control circuit 12b, the initial 1→0 transition of signal line GP2 during the first portion of the pull-up time interval will translate into a delayed 1→0 transition at an input of the second latch 14b. This 1→0 transition will then cause the output of the multi-input logic gate NAND1 to transition from 0→1 and the output of inverter INV3 to transition from 1→0. In response to these transitions, the output of multi-input logic gate NAND4 will switch from 0→1 at the commencement of the second portion of the pull-up time interval, to turn-off PMOS pull-up transistor P2 and increase the effective resistance of the pull-up path after the voltage on the output signal line (DATA OUT) has increased to a level above $V_{IH}$. This increase in the resistance of the pull-up path lessens the degree to which supply/Vdd bounce fluctuations will be represented as noise on the output signal line (DATA OUT). Moreover, like the operation of the pull-down portion of the output buffer described with respect to FIG. 2, the use of direct feedback from the gate electrode of PMOS pull-up transistor P2 to the input of the second delay unit DELAY 2 facilitates smooth monotonic pull-up of the output signal line during the entire pull-up time interval.

Figure 4:
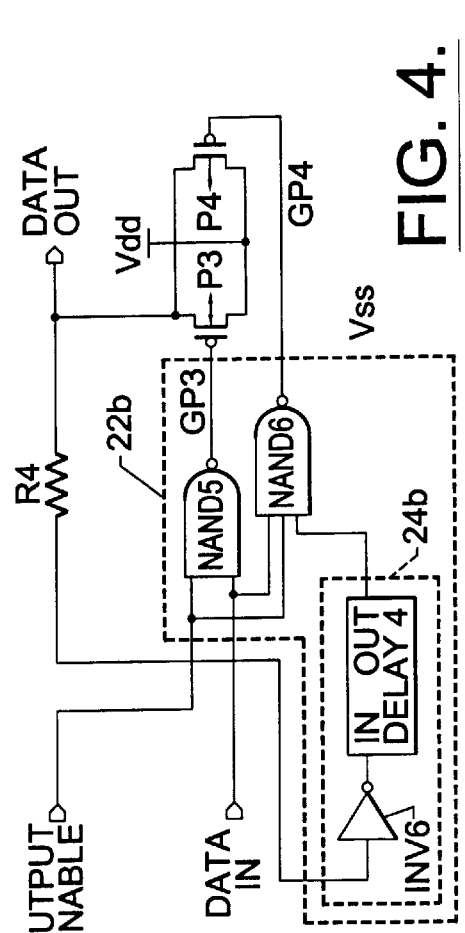
FIG. 4 is an electrical schematic of a pull-up circuit according to the second embodiment of the present invention.
Figure 3:
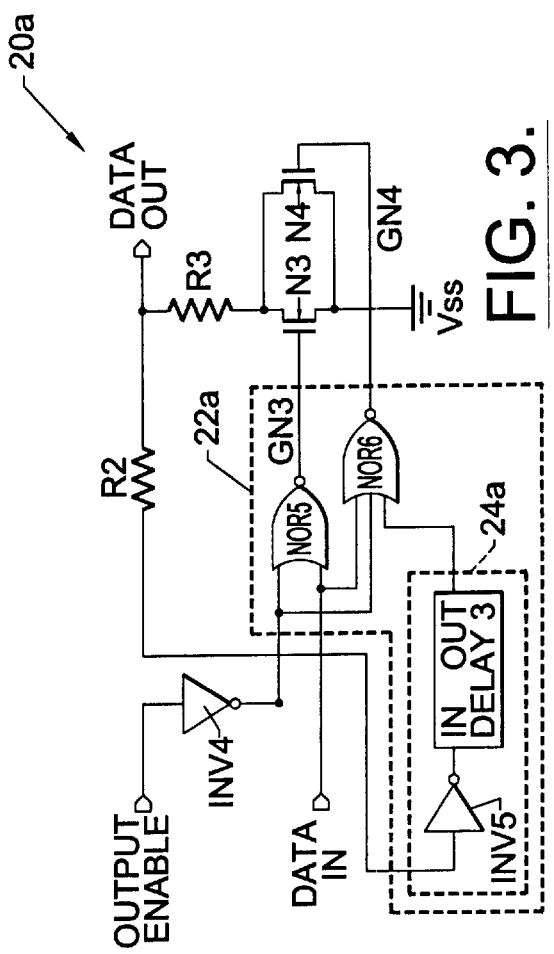
FIG. 3 is an electrical schematic of a pull-down circuit according to a second embodiment of the present invention.

Referring now to FIGS. 3–4, an integrated circuit output buffer according to a second embodiment of the present invention includes a pull-down circuit 20a and a pull-up circuit 20b. As illustrated, the pull-down circuit 20a includes first and second pull-down switches that are electrically connected in parallel. These first and second pull-down switches may be provided by NMOS pull-down transistors N3 and N4 that are electrically connected to an output signal line (DATA OUT) by a resistor R3. This resistor R3 provides electrostatic discharge (ESD) protection and may have a value of about 10Ω, for example. A pull-down control circuit 22a is also provided to control the turn-on and turn-off of the pull-down transistors N3 and N4 in such a manner to inhibit simultaneous-switching noise by reducing the degree of coupling between the output signal line (DATA OUT) and the first reference signal line Vss at the end of each pull-down transition. In particular, the pull-down control circuit 22a receives as an input a signal fed back through resistor R2 (e.g., 200Ω) from the output signal line (DATA OUT) to control the turn-off of NMOS pull-down transistor N4 during a second portion of a pull-down time interval. However, because a pull-down transition of the output signal line during the pull-down time interval may not be entirely monotonic because of the presence of parasitic package and wire bond inductances, for example, the use of direct feedback from the output signal line to an input of the pull-down control circuit 22a may not be preferred since this feedback signal will also be influenced by any external parasitic inductance. Nonetheless, the pull-down circuit 20a may be used to inhibit simultaneous-switching noise in output buffers.

Operation of the pull-down circuit 20a of FIG. 3 will now be described in detail. Here, a quiescent DC condition can be initially established with the input signal line (DATA IN) set to a logic 1 level (while OUTPUT ENABLE=1). Once this condition has been established, the outputs of inverters INV4 and INV5, the outputs of the multi-input logic gates NOR5 and NOR6 and the output of the third delay device (DELAY 3) will all be set to logic 0 levels. Here, inverter INV5 and the third delay device (DELAY 3) collectively form a first inverting delay device 24a. If the input signal line (DATA IN) then transitions from 1→0, the pull-down control circuit 22a will initially turn on both of the pull-down transistors N3 and N4 during a first portion of a pull-down time interval by driving signal lines GN3 and GN4 from 0→1. Once the input signal line (DATA IN) initially transitions to a logic 0 level, all the inputs to the multi-input logic gates NOR5 and NOR6 will be set to logic 0 levels and the outputs of the pull-down control circuit 22a will be set to logic 1 levels. This action by the pull-down control circuit 22a results in the formation of a low resistance pull-down path between the output signal line (DATA OUT) and the reference signal line Vss. Accordingly, turn-on of the pull-down transistors N3 and N4 during a first portion of the pull-down time interval will cause the output signal line to transition from 1→0. Then, at some point during the first portion of the pull-down time interval, the output of inverter INV5 will switch from 0→1. In response to this transition in the output of INV5, the output of the third delay unit DELAY 3 will transition from 0→1 and the output of multi-input logic gate NOR6 will transition from 1→0 to turn off NMOS pull-down transistor N4 at the commencement of the second portion of the pull-down time interval. However, after completion of the pull-down time interval, NMOS pull-down transistor N3 remains conductive. The on-state resistance of NMOS pull-down transistor N3 and the value of resistor R3 can, therefore, be chosen to provided excellent impedance matching characteristics during DC operation.

Referring now specifically to FIG. 4, the pull-up circuit 20b includes first and second pull-up switches which are electrically connected in parallel. These first and second pull-up switches may be provided by PMOS pull-up transistors P3 and P4 and a pull-up control circuit 22b to control the turn-on and turn-off of the pull-up transistors P3 and P4 in a manner which inhibits simultaneous-switching noise by reducing the degree of coupling between the output signal line (DATA OUT) and the supply line Vdd at the end of each pull-up transition. As illustrated, the pull-up control circuit 22b receives as an input a signal fed back through resistor R4 (e.g., 200Ω) from the output signal line (DATA OUT) to control the turn-off of PMOS pull-up transistor P4 during a second portion of a pullup time interval. However, as described above with respect to the pull-down circuit 20a of FIG. 3, a pull-up transition of the output signal line during the pull-up time interval may not be entirely monotonic because of the presence of parasitic package and wire bond inductances, for example. Thus, the use of direct feedback from the output signal line to an input of the pull-up control circuit 22b may not be preferred since this feedback signal may also be influenced by any external parasitic inductance.

Operation of the pull-up circuit of FIG. 4 will now be described in detail. In this circuit, a quiescent DC condition can be initially established with the input signal line (DATA IN) set to a logic 0 level (while OUTPUT ENABLE=1). Once this condition has been established, the output of inverter INV6, the outputs of the multi-input logic gates NAND5 and NAND6 and the output of the fourth delay device (DELAY 4) will all be set to logic 1 levels. Here, inverter INV6 and the fourth delay device (DELAY 4) collectively form a second inverting delay device 24b. If the input signal line (DATA IN) then transitions from 0→1, the pull-up control circuit 22b will initially turn on both of the pull-up transistors P3 and P4 during a first portion of a pull-up time interval by driving signal lines GP3 and GP4 from 1→0. Accordingly, once the input signal line (DATA IN) initially transitions to a logic 1 level, all the inputs to the multi-input logic gates NAND5 and NAND6 will be set to logic 1 levels and the outputs of the pull-up control circuit 22b will be set to logic 0 levels. This action by the pull-up control circuit 22b results in the formation of a low resistance pull-up path between the output signal line (DATA OUT) and the supply line Vdd. Accordingly, turn-on of the pull-up transistors P3 and P4 during a first portion of the pull-up time interval will cause the output signal line to transition from 0→1. Then, at some point during the first portion of the pull-up time interval, the output of inverter INV6 will switch from 1→0. In response to this transition in the output of INV6, the output of the fourth delay unit DELAY 4 will transition from 1→0 and the output of multi-input logic gate NAND6 will transition from 0→1 to turn off PMOS pull-up transistor P4 at the commencement of the second portion of the pull-up time interval. Pull-up during the second portion of the pull-up time interval is then provided by the PMOS pull-up transistor P3 which may have an on-state resistance designed to provided impedance matching.

Figure 5:
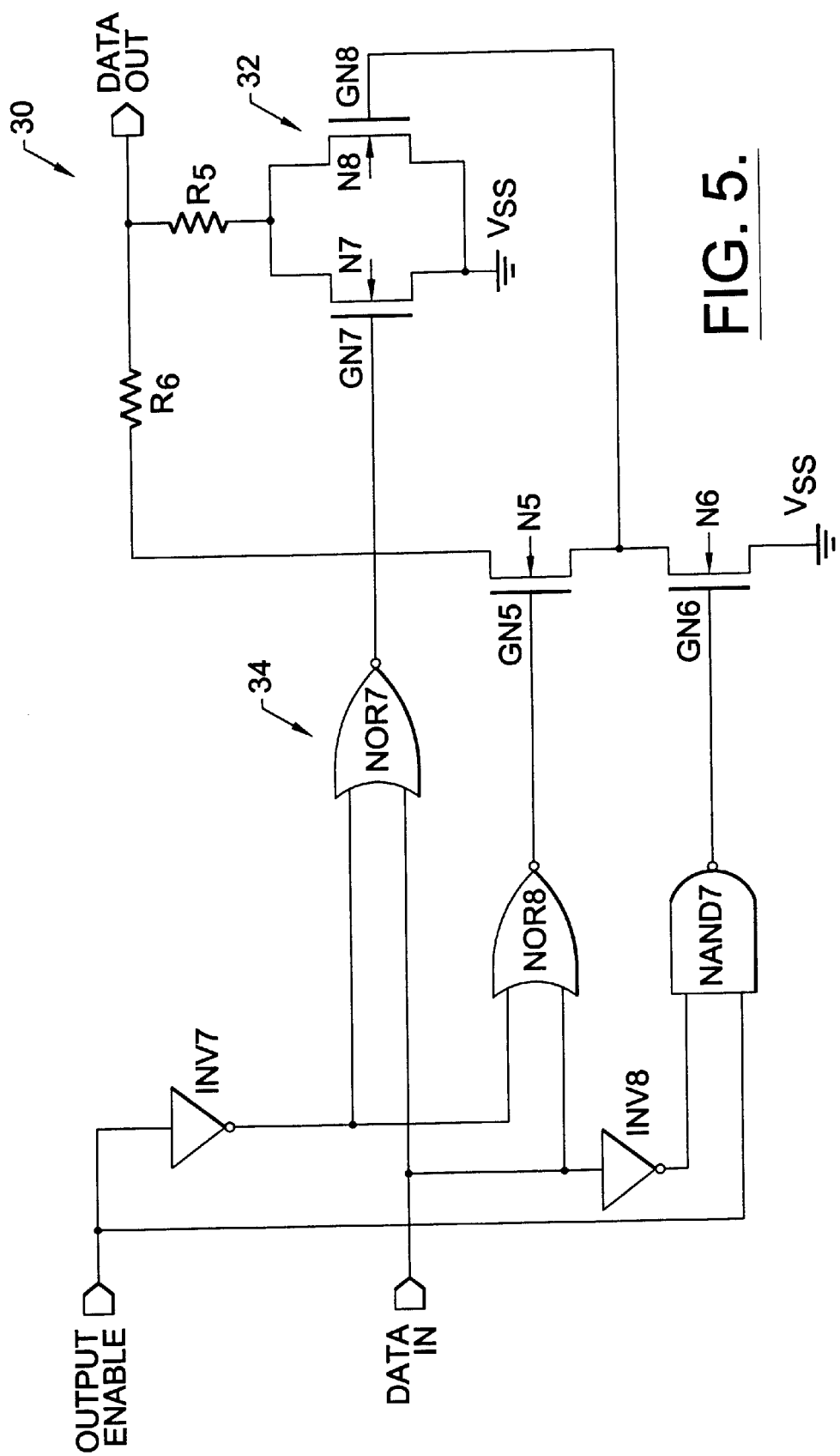
FIG. 5 is an electrical schematic of a pull-down portion of an output buffer according to a third embodiment of the present invention.

Referring now to FIG. 5, an integrated circuit output buffer 30 according to a third embodiment of the present invention will be described. In this embodiment, a pull-down circuit 32, a control circuit 34 and an output signal line (DATA OUT) are provided. As illustrated, the pull-down circuit 32 may be provided by a pair of NMOS transistors (N7 and N8) that are electrically connected in parallel and an ESD protection resistor R5 that electrically couples the drain electrodes of the pair of transistors N7 and N8 to the output signal line. The ESD protection resistor R5 may have a resistance of 10 ohms, for example. The source electrodes of the pair of transistors N7 and N8 are also electrically connected to a first reference signal line (e.g., Vss). The buffer 30 also includes a preferred control circuit 34 that activates the pull-down circuit 32 by turning on both the primary and secondary pull-down transistors N7 and N8 during a leading portion of a pull-down time interval, and then turning off the secondary pull-down transistor N8 during a trailing portion of the pull-down time interval using a first feedback switch that is electrically coupled in series between the output signal line and a gate electrode of the secondary pull-down transistor N8. As illustrated by the embodiment of FIG. 5, the feedback switch may comprise an NMOS transistor N5 and the drain electrode of the NMOS transistor N5 may be electrically coupled to the output signal line DATA OUT by a feedback resistor R6 that may have a resistance of about 200 ohms.

An NMOS pull-down transistor N6 may also be provided. As illustrated, this pull-down transistor N6 may be electrically connected in series between the gate electrode of the secondary pull-down transistor N8 and the first reference signal line (e.g., Vss). According to a preferred aspect of this embodiment of the present invention, the control circuit 34 may also comprise a pair of inverters (INV7, INV8), a pair of NOR gates (NOR7, NOR8) and a NAND gate (NAND7), connected as illustrated. The control circuit 34 is also responsive to an enable signal (OUTPUT ENABLE) and a data input signal (DATA IN). When the enable signal is held at a logic 0 level and the data input signal DATA IN is held at a logic 0 or logic 1 level, the gate electrode of the primary pull-down transistor N7 and the gate electrode of the NMOS transistor N5 will be held at logic 0 levels. In addition, the gate electrode of the pull-down transistor N6 will be held at a logic 1 level and the gate electrode of the secondary pull-down transistor N8 will be pulled down to a logic 0 level. Accordingly, the pull-down transistor N6 will be turned on, however, the primary and secondary pull-down transistors N7 and N8 and the NMOS transistor N5 (acting as the feedback switch) will be turned off. These same conditions will also be present when the data input signal DATA IN is set to a logic 1 level and the output enable signal is set to a logic 1 level.

However, if during DC quiescent operation with the output enable signal line and the output signal line DATA OUT set to logic 1 levels, the data input signal line DATA IN transitions from 1→0, the gate electrodes of the primary pull-down transistor N7 and the NMOS feedback transistor N5 will transition from 0→1 and the gate electrode of the NMOS pull-down transistor N6 will transition from 1→0. When this occurs, the primary pull-down transistor N7 and the feedback transistor N5 will both turn on and the NMOS pull-down transistor N6 will turn off. The logic 1 level previously established on the output signal line DATA OUT will also be passed through the feedback resistor R6 and feedback transistor N5 to the gate electrode of the secondary pull-down transistor N8. Accordingly, the secondary pull-down transistor N8 will also be turned on and both the primary and secondary pull-down transistors N7 and N8 will operate to pull-down the output signal line DATA OUT by providing a low resistance path between the ESD protection resistor and the first reference signal line Vss.

However, as the voltage of the output signal line DATA OUT begins to drop, the voltage at the gate electrode of the secondary pull-down transistor N8 will also begin and continue to drop until it is below the threshold voltage of the secondary pull-down transistor N8. When this occurs, the secondary pull-down transistor N8 will turn off and the trailing portion of the pull-down time interval will commence with the only pull-down influence being provided by the primary pull-down transistor N7. Thus, the primary pull-down transistor N7 remains conductive for the entire duration of a pull-down time interval and thereby provides a static pull-down characteristic, while the secondary pull-down transistor N8 remains conductive during only the leading portion of the pull-down time interval and thereby provides a dynamic or transient pull-down characteristic. The consequence of this is that the output resistance of the output buffer is reduced during switching (resulting in reduced delays) and is increased after switching is complete (resulting in low overshoot/undershoot).

As will be understood by those skilled in the art, the feedback path containing resistor R6 and NMOS transistor N5 may be designed so that the secondary pull-down transistor does not turn off until after the output signal line (DATA OUT) has transitioned below a threshold logic 0 level for purposes of switching devices having inputs electrically connected to the output signal line (i.e., $V_{DATA\ OUT} \leq V_{IL}$, where $V_{IL}$ is defined as the maximum input voltage that will be unambiguously recognized as a logic 0 signal by a device being driven by the output signal line). The size and threshold voltage of the NMOS transistor N5 in the feedback path may also be used to control the rate of turn on (and turn off) of the secondary pull-down transistor N8 and the highest voltage to which the gate electrode of the secondary pull-down transistor N8 will reach at the commencement of the pull-down time interval, respectively. If the width of the NMOS transistor N5 is made relatively small, the contribution to dynamic switching provided by the secondary pull-down transistor N8 will be reduced because the rate of turn on and turn off of the secondary pull-down transistor N8 will be reduced and the on-state resistance of the secondary pull-down transistor N8 will be increased. Moreover, if the threshold voltage "Vth" of the NMOS transistor N5 is too high, the maximum pull-down capability of the secondary pull-down transistor will be reduced because the maximum voltage at the gate electrode of the secondary pull-down transistor N8 (i.e., $V_{G8|max}$) will be reduced since:

$$V_{G8|max} = V_{DATA\ OUT-max} - Vth \quad (1)$$

Figure 6:
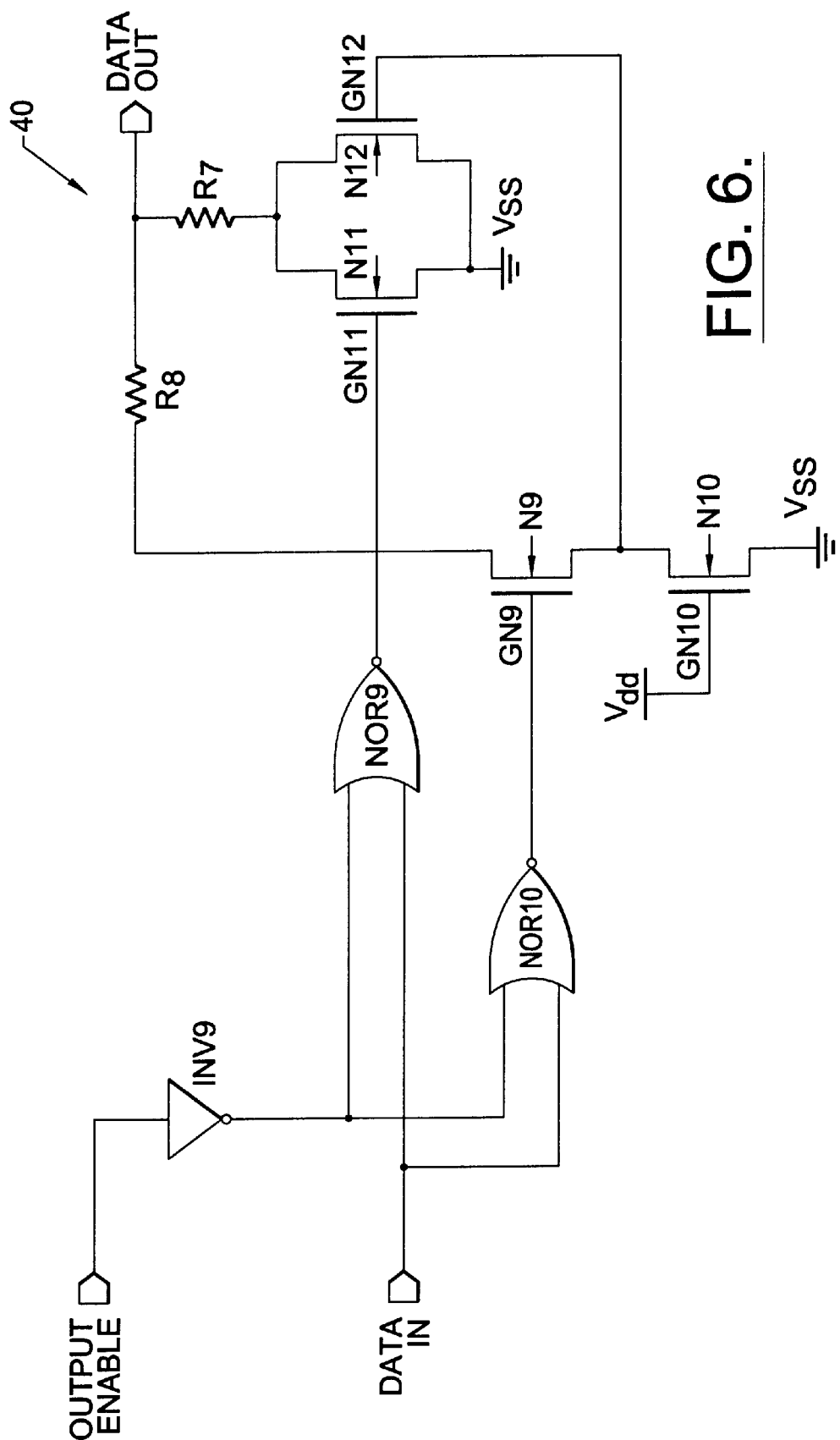
FIG. 6 is an electrical schematic of a pull-down portion of an output buffer according to a fourth embodiment of the present invention.

Referring now to FIG. 6, an integrated circuit output buffer 40 according to a fourth embodiment of the present invention includes primary and secondary pull-down transistors N11 and N12, respectively, an ESD protection resistor R7 and a control circuit comprising a feedback resistor R8, a feedback switch (NMOS transistor N9), a pair of NOR gates (NOR9 and NOR10), an inverter (INV9) and an NMOS pull-down transistor N10. This output buffer 40 is similar to the output buffer of FIG. 5, however, a greater degree of independence can be provided between the rate of turn on and turn off of the secondary pull-down transistor N12 and the minimum on-state resistance of the secondary pull-down transistor N12 during the leading portion of the pull-down time interval. The minimum on-state resistance is achieved when the voltage applied to the gate electrode of the secondary pull-down transistor N12 is at a maximum.

This greater degree of independence between turn-on/turn-off rate and minimum on-state resistance is achieved by maintaining the NMOS pull-down transistor N10 in a conductive state during both pull-up and pull-down time intervals, by connecting the gate electrode of the NMOS pull-down transistor N10 to a logic 1 reference signal line (e.g., Vdd). Based on this configuration, the minimum on-state resistance of the secondary pull-down transistor N12 will be a function of the on-state resistance of the NMOS pull-down transistor N10 ($R_{N10}$), the on-state resistance of the NMOS transistor N9 ($R_{N9}$) and the value of the feedback resistor R8. This is because by voltage division the maximum value of the voltage ($VG_{12}$) applied to the gate electrode of the secondary NMOS pull-down transistor N12 during the pull-down time interval will be equal to:

$$V_{G12|max} = V_{DATA\ OUT-max}(R_{N10}/(R_{N10} + R_{N9} + R8)) \quad (2)$$

where $V_{DATA\ OUT-max}$ equals the magnitude of the voltage on the output signal line DATA OUT at the commencement of the pull-down time interval. Accordingly, the rate of turn on and turn off of the secondary pull-down transistor N12 can be carefully controlled by proper design of the width of the NMOS transistor N9 and the value of feedback resistor R8 and the minimum on-state resistance of the pull-down path through resistor R7 and transistors N11 and N12 can be controlled by proper design of the width of the NMOS pull-down transistor N10.

Figure 7:
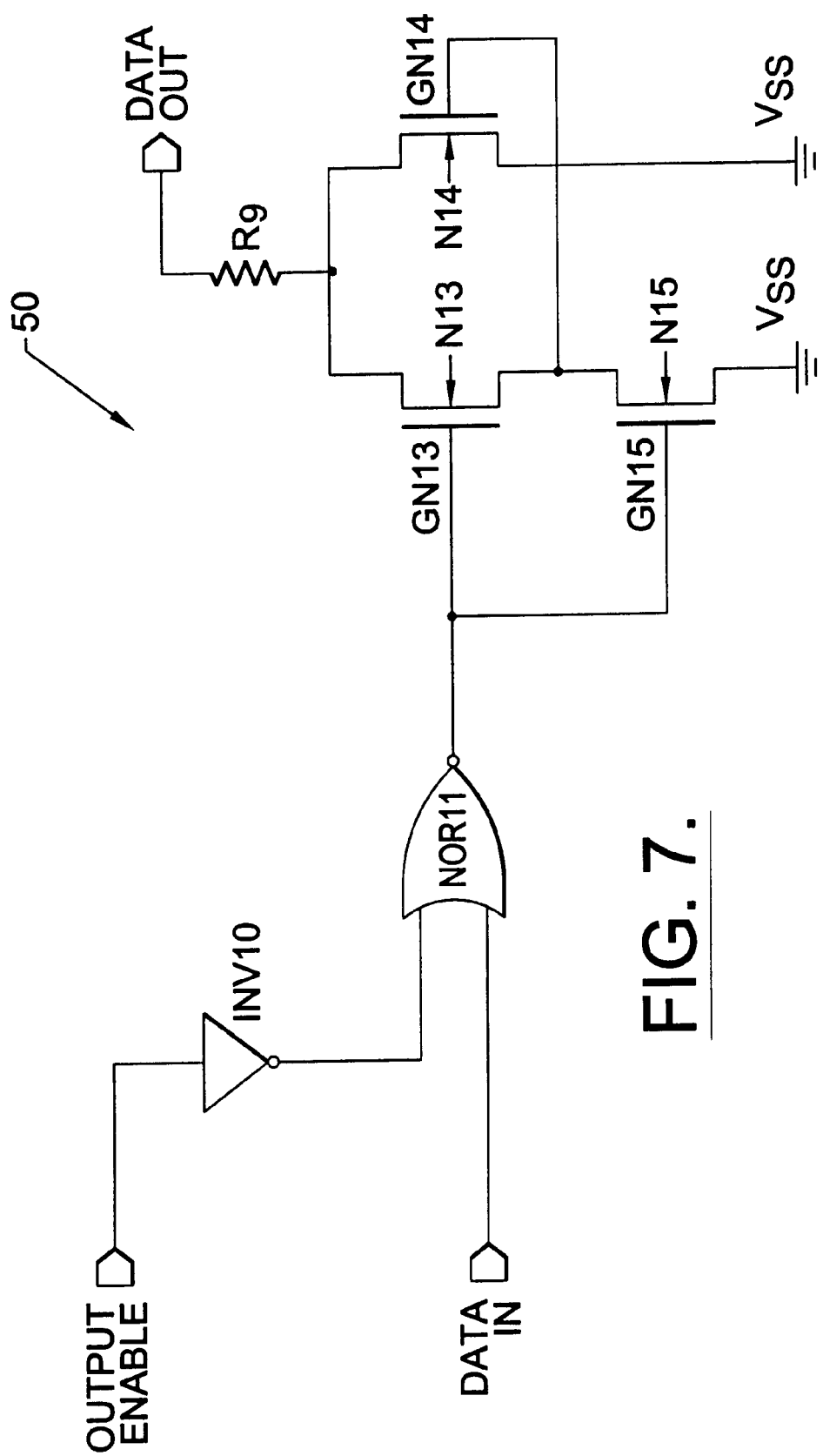
FIG. 7 is an electrical schematic of a pull-down portion of an output buffer according to a fifth embodiment of the present invention.

Referring now to FIG. 7, an integrated circuit output buffer 50 according to a fifth embodiment of the present invention includes first and second primary pull-down transistors N13 and N15, respectively, in a static pull-down path and a secondary pull-down transistor N14 in a dynamic pull-down path. An ESD protection resistor R9 is also provided, as illustrated. A control circuit is also provided by an inverter (INV10) and a NOR gate (NOR11). As will be understood by those skilled in the art, the output of the NOR gate (NOR11) will only be driven to a logic 1 level when the data input signal line DATA IN is at a logic 0 level and the output enable signal line OUTPUT ENABLE is at a logic 1 level. When these conditions are present, the first and second primary pull-down transistors N13 and N15 will be turned on and operate to pull-down the output signal line DATA OUT through the ESD protection resistor R9. Moreover, because the first and second primary pull-down transistors N13 and N15 act as a resistive divider, the relative size of these transistors can be designed to provide a desired degree of dynamic pull-down by controlling the magnitude of the maximum turn-on voltage applied to the gate electrode of the secondary pull-down transistor N14. Here, the maximum voltage at the gate electrode of the secondary pull-down transistor N14 will be a function of the on-state resistances of the first and second primary pull-down transistors $R_{N13}$ and $R_{N15}$ and the resistance of the ESD protection resistor R9:

$$V_{G14|max} = V_{DATA\ OUT-max}(R_{N15}/(R_{N15} + R_{N3} + R9)) \quad (3)$$

This fifth embodiment provides advantages over the embodiments of FIGS. 5–6, by reducing the amount of circuitry required to operate the secondary pull-down transistor N14 in the dynamic pull-down path. However, the design of this embodiment is complicated by the addition of the second transistor N15 in the static pull-down path since the sizing of both of the primary pull-down transistors N13 and N15 will need to be considered when establishing the desired pull-down strength requirements of the buffer 50. Although not shown, this fifth embodiment may also include corresponding circuitry for performing preferred pull-up operations.

Figure 8:
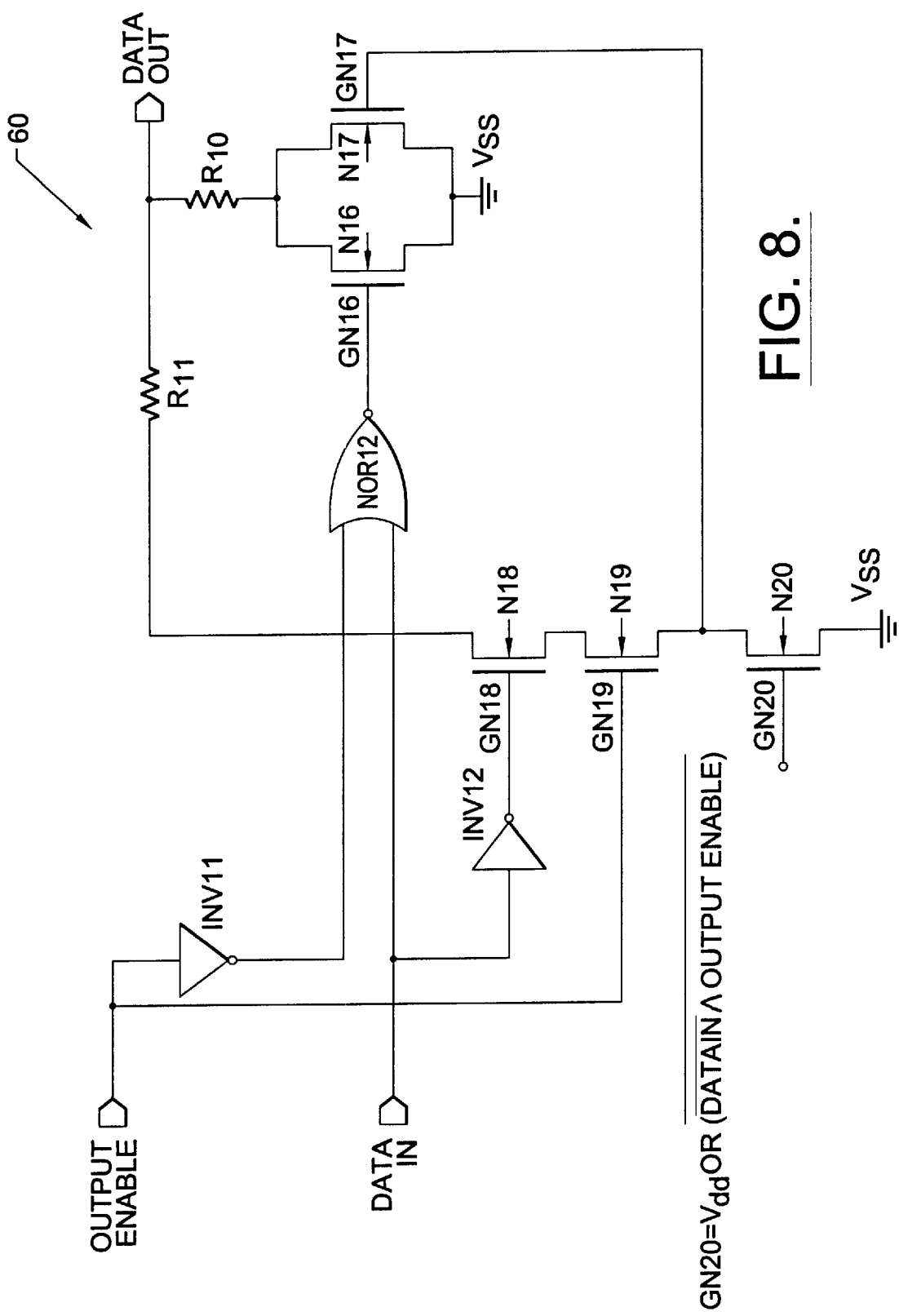
FIG. 8 is an electrical schematic of a pull-down portion of an output buffer according to a sixth embodiment of the present invention.

Referring now to FIG. 8, an integrated circuit output buffer 60 according to a sixth embodiment of the present invention includes a pair of serially-connected NMOS transistors N18 and N19 that operate as a feedback switch. This feedback switch is turned on when the output enable signal line is held at a logic 1 level and the data input signal line DATA IN is switched to logic 0 level. The primary and secondary pull-down transistors are provided by NMOS transistors N16 and N17 and the ESD protection resistor R10 electrically connects the pull-down transistors to the output signal line. The NMOS transistors N18 and N19 and feedback resistor N11 provide the feedback path which extends from the data output signal line to the gate electrode of the secondary NMOS pull-down transistor N17. Control of the primary pull-down transistor N16 is also provided by NOR gate NOR12 and inverter INV11. Moreover, as will be understood by those skilled in the art, the NMOS transistors N18 and N19 and the inverter INV12 perform the same function as the NOR gate NOR8 and NMOS transistor N5 in FIG. 5 (and as the NOR gate NOR10 and NMOS transistor N9 in FIG. 6). The NMOS pull-down transistor N20 can also be controlled to perform the same function as the NMOS pull-down transistor N6 of FIG. 5 or the NMOS pull-down transistor N10 of FIG. 6. Accordingly, the gate electrode GN20 of the NMOS pull-down transistor N20 can receive a logic 1 reference signal Vdd at all times or receive a logic 1 signal whenever the input signal line is at a logic 1 potential or the output enable signal line is at a logic 0 potential.

Figure 9:
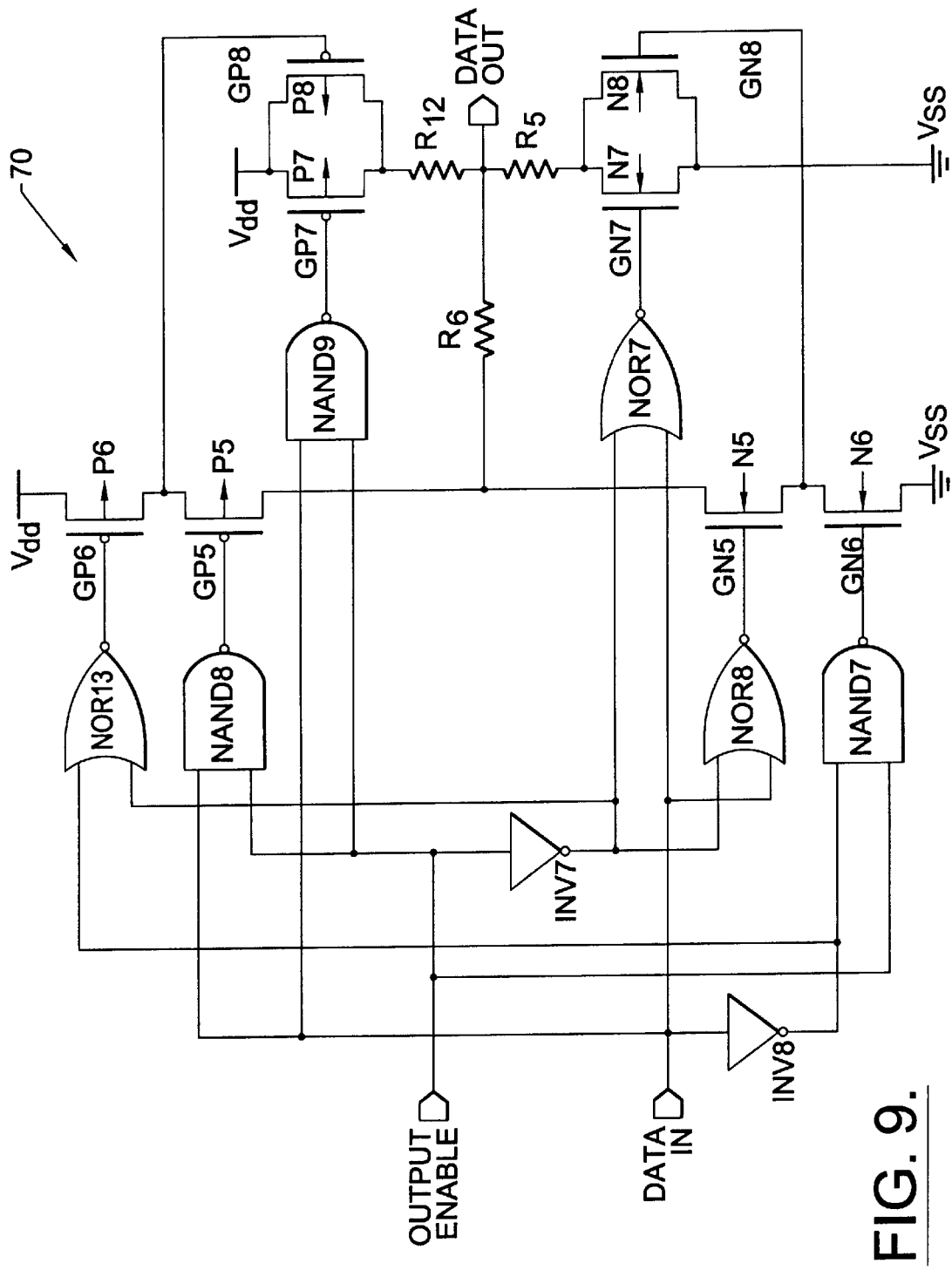
FIG. 9 is an electrical schematic of an output buffer according to the third embodiment of the present invention.

Each of the above-described embodiments of FIGS. 5–8 may also include a corresponding pull-up circuit that is designed to provide both static and dynamic pull-up characteristics. For example, as illustrated by FIG. 9, the output buffer of FIG. 5 may be expanded to include a corresponding pull-up circuit having both static and dynamic pull-up characteristics. In particular, the output buffer 70 of FIG. 9 may include a pull-up circuit comprising an ESD protection resistor R12, a primary PMOS pull-up transistor P7 and a secondary PMOS pull-up transistor P8. An additional second feedback switch may also be provided by PMOS transistor P5 which is electrically connected to the feedback resistor R6 and the gate electrode of the secondary PMOS pull-up transistor P8. Alternatively, like the embodiment of FIG. 8, the second feedback switch may be provided by a pair of serially-connected PMOS transistors (not shown). The control circuit also includes a pair of NAND gates (NAND8 and NAND9), a NOR gate (NOR 13) and a PMOS pull-up transistor P6, connected as illustrated.

Based on this configuration, the control circuit performs the function of activating the pull-up circuit by turning on both the primary and secondary pull-up transistors P7 and P8 during a leading portion of a pull-up time interval and then turning off the secondary pull-up transistor P8 during a trailing portion of the pull-up time interval using the second feedback switch. Here, the second feedback switch and the primary pull-up transistor P7 are turned on when the data input signal line transitions from 0→1 and the output enable signal line is at a logic 1 level (i.e., when the following boolean expression is satisfied: OE∧DI=1). In contrast, the PMOS pull-up transistor P6 is turned on when OE∧DI=0. Alternatively, the PMOS pull-up transistor P6 may be turned on at all times by electrically connecting its gate electrode to a logic 0 reference signal line.

Figure 10:
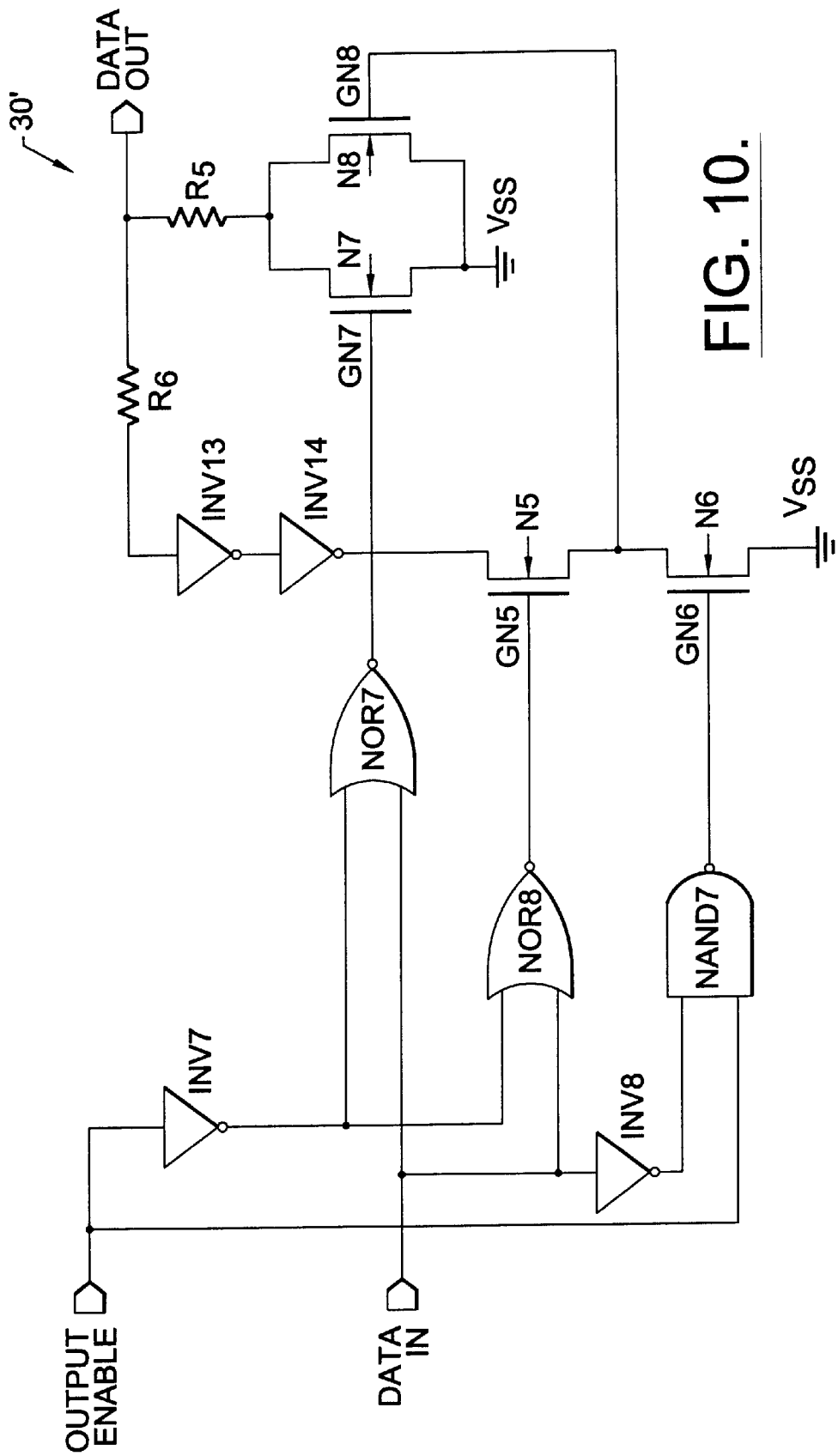
FIG. 10 is an electrical schematic of a pull-down portion of an output buffer according to a seventh embodiment of the present invention.

Referring now to FIG. 10, an integrated circuit output buffer 30' according to a seventh embodiment of the present invention is similar to the embodiment of FIG. 5, however, the feedback path from the output signal line DATA OUT has been modified to include a pair of serially-connected inverters INV13 and INV14, as illustrated. These serially-connected inverters can be configured to set the point in time at which the secondary pull-down transistor N8 begins to turn off and also increase the rate at which the secondary pull-down transistor N8 turns off once a "trip-point" has been crossed and the output of the second inverter INV14 in the pair undergoes a sharp 1→0 transition. As will be understood by those skilled in the art, the level of this "trip-point" can be adjusted through proper design of the characteristics of inverters INV13 and INV14. In contrast, the rate of turn off of the secondary pull-down transistor N8 of FIG. 5 is much more gradual and is proportional to the rate at which the output signal line DATA OUT transitions from a logic 1 level to a logic 0 level. The exact point in time at which the secondary pull-down transistor N8 of FIG. 5 is actually turned off (e.g., $V_{G8} \leq V_{th}$) is also more difficult to control. Thus, by adding a pair of inverters in series in the feedback path, improved turn-off control can be achieved, although somewhat greater susceptibility to noise may be present.

Figure 11:
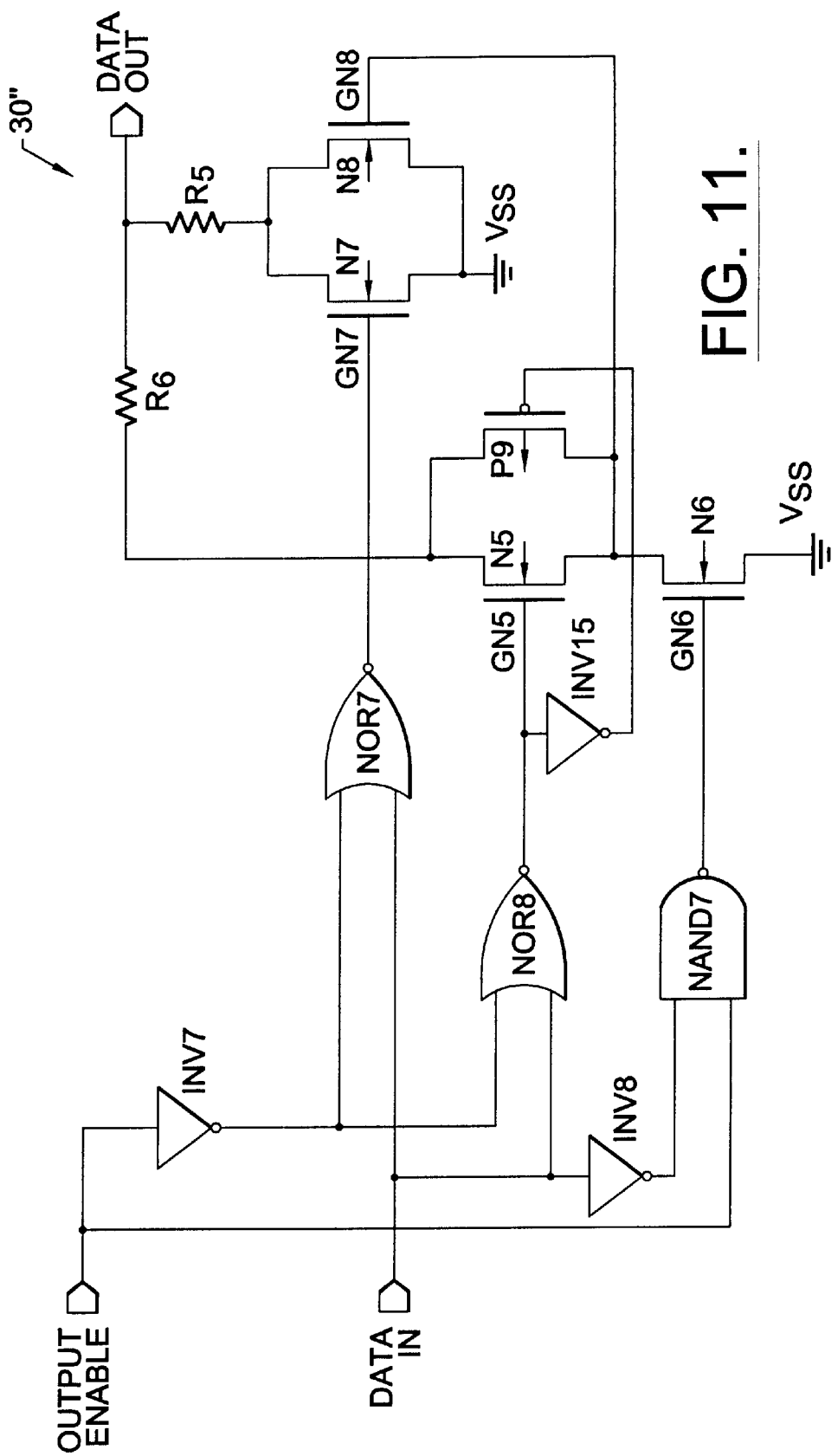
FIG. 11 is an electrical schematic of a pull-down portion of an output buffer according to an eighth embodiment of the present invention.

Referring now to FIG. 11, an integrated circuit output buffer 30'' according to an eighth embodiment of the present invention is similar to the embodiment of FIG. 5, however, a PMOS transistor P9 has been added in parallel with the NMOS transistor N5 to form a complete CMOS transmission gate. An inverter INV15 is also provided so that the NMOS transistor N5 and PMOS transistor P9 can both be simultaneously turned on and off. The addition of the PMOS transistor P9 will increase the maximum voltage at the gate electrode of the secondary pull-down transistor N8 (i.e., $V_{G8|max}$) by eliminating the threshold voltage drop reduction illustrated by equation (1) above. This aspect of the eighth embodiment can also be applied to the other embodiments of FIGS. 6 and 8. There is a tradeoff, however, since the introduction of the additional PMOS transistor and inverter INV15 will increase buffer cell area and power consumption.

Figure 12A:
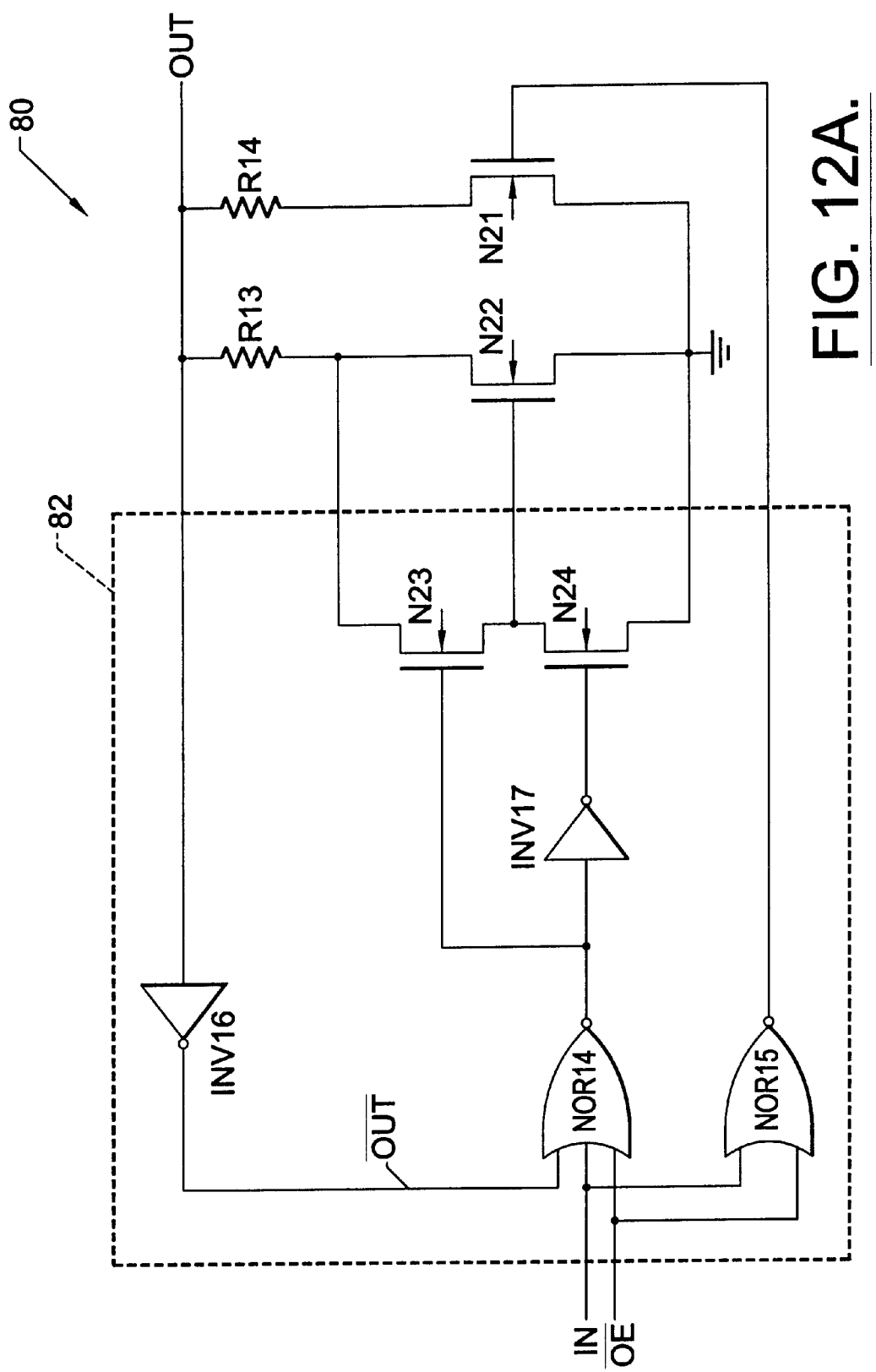
FIG. 12A is an electrical schematic of a pull-down portion of a non-inverting output buffer according to a ninth embodiment of the present invention.
Figure 12B:
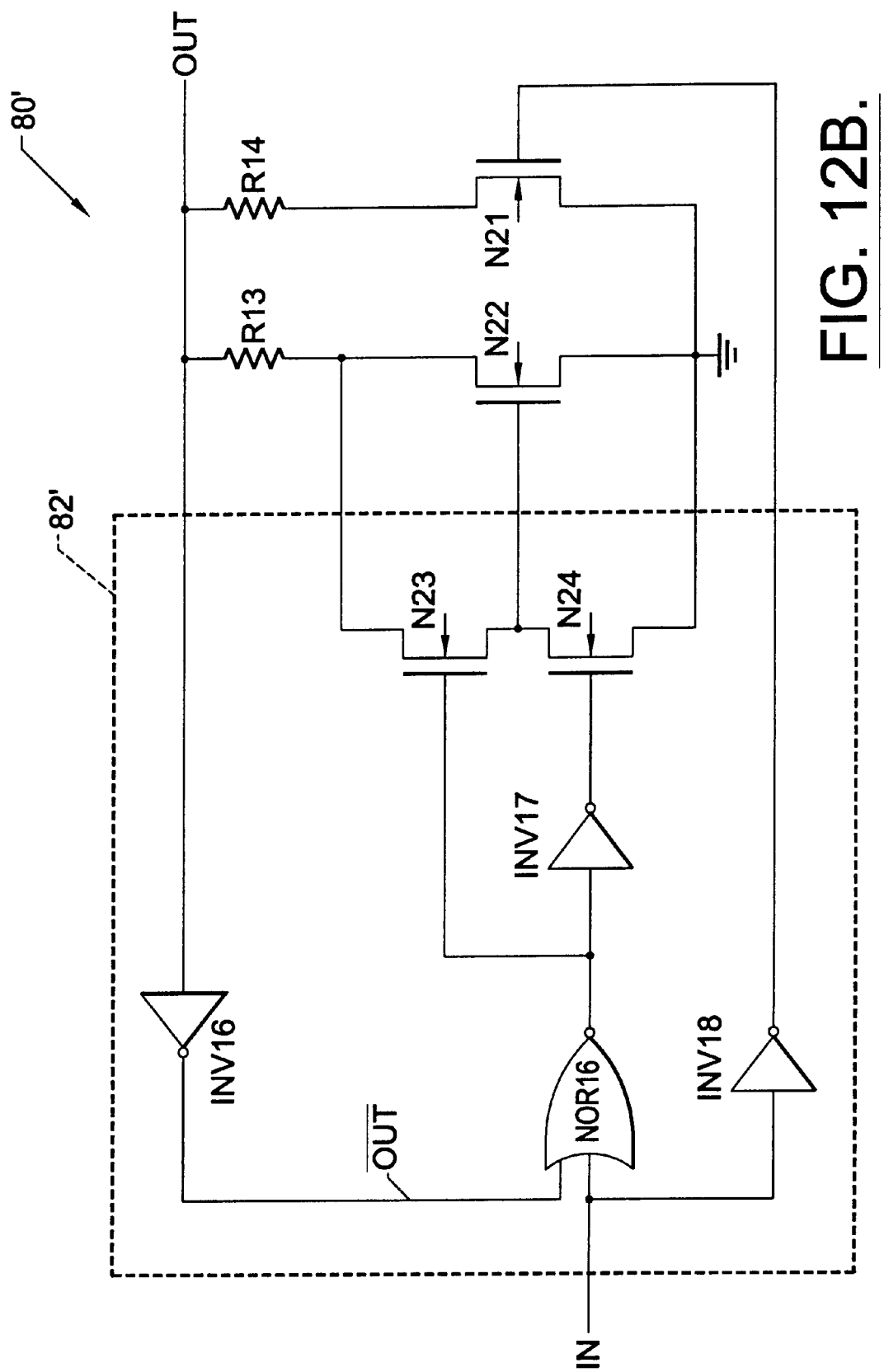
FIG. 12B is an alternative electrical schematic of a pull-down portion of a non-inverting output buffer according to the ninth embodiment of the present invention.

Referring now to FIGS. 12A–12B, integrated circuit output buffers 80 and 80' according to ninth embodiments of the present invention will be described. In particular, FIG. 12A illustrates a preferred pull-down portion of a non-inverting output buffer that includes primary and secondary NMOS pull-down transistors N21 and N22 and an output signal line OUT that is electrically coupled to the drains of the NMOS pull-down transistors N21 and N22. As illustrated, the output signal line OUT is electrically coupled to each of the drains of the NMOS pull-down transistors N21 and N22 by respective resistors R14 and R13, respectively. These resistors may have resistance values in a range between about 5 and 25 ohms, depending on speed and drive strength requirements. The preferred pull-down portion of the non-inverting buffer also includes an NMOS gate pull-up transistor N23 and an NMOS gate pull-down transistor N24. A gate control inverter INV17 is also provided so that the gates of the gate pull-up transistor N23 and gate pull-down transistor N24 receive complementary signals. For example, when the gate of the gate pull-up transistor N23 is driven to a logic 1 potential, it turns on to thereby electrically connect the gate and drain of the secondary NMOS pull-down transistor N22 together. When the gate pull-up transistor N23 turns on, the secondary NMOS pull-down transistor N22 operates as a diode to pull down the output signal line OUT. Alternatively, when the gate of the gate pull-down transistor N24 is driven to a logic 1 potential it turns on to thereby turn off the secondary NMOS pull-down transistor N22 by electrically connecting the gate and source of the secondary NMOS pull-down transistor N22 together. A pair of multi-input NOR gates NOR14 and NOR15 are also provided. The two-input NOR gate NOR15 is responsive to an input signal IN and a complementary output enable signal ($\overline{OE}$). Accordingly, driving the input signal IN to a logic 0 potential when the output enable signal OE is active at a logic 1 potential will operate to turn on the primary NMOS pull-down transistor N21 since a logic 1 potential will be generated at the output of the NOR gate NOR15. Turn-on of the primary NMOS pull-down transistor N21 will operate to continuously pull-down the output signal line OUT to a logic 0 potential during first and second consecutive portions of a pull-down time interval. Because the NMOS pull-down transistor N21 may be relatively large, a pair of inverters may be provided in series between an output of the NOR gate NOR15 and the gate electrode of NMOS pull-down transistor N21. The sizes of these pair of inverters may be chosen at different values to provide sufficient drive capability to the primary NMOS pull-down transistor N21. The use of inverters in the drive path may also enable the size of the NOR gate NOR15 to be reduced. This alternative arrangement is particularly useful when the circuit driving the NOR gate NOR15 is relatively weak.

In contrast, the three-input NOR gate NOR14 can be used in combination with the gate control inverter INV17 and the gate pull-up and gate pull-down transistors N23 and N24, to selectively turn on the secondary NMOS pull-down transistor N22 at the commencement of the pull-down time interval and then turn off the secondary NMOS pull-down transistor N22 during the second portion of the pull-down time interval. In particular, the three-input NOR gate NOR14 can be controlled to generate a signal having a logic 1 potential at the commencement of the pull-down time interval (when all three inputs $\overline{OE}$, IN and $\overline{OUT}$ are set at logic 0 levels) and then switch this generated signal from a logic 1 potential to a logic 0 potential once the potential of the output signal line OUT has been pulled down to a threshold logic 0 potential and thereby caused the output of a feedback inverter INV16 to generate a signal having a logic 1 potential. Thus, the three-input NOR gate NOR14 can be used to selectively turn on the NMOS gate pull-up transistor N23 at the commencement of the pull-down time interval and during the first portion thereof and then turn on the NMOS gate pull-down transistor N24 during the second portion of the pull-down time interval when the output of the NOR gate NOR14 transitions from a logic 1 potential to a logic 0 potential. To improve dynamic responsiveness of the control circuit, the sum of the delays associated with the feedback inverter INV16, the three-input NOR gate NOR14 and the gate control inverter INV17 should be substantially shorter than the duration of the first portion of the pull-down time interval. This requirement is typically satisfied given the relatively large capacitive loading attached to the output signal line OUT.

This preferred pull-down portion of an output buffer 80 therefore comprises a control circuit 82 that is responsive to an input signal (IN) and an output signal (OUT) fed back from the output signal line (OUT). This control circuit 82 includes logic devices therein that provide the gate of the primary NMOS pull-down transistor N21 with a first gate signal that tracks $\overline{IN}$ (when OE is at a logic 1 level), and provide the gate of at least one of the gate pull-up transistor N23 and the gate pull-down transistor N24 with a second gate signal that is a function of $\overline{IN} \wedge OUT$ (when OE is at a logic 1 level), where $\overline{IN} \wedge OUT$ equals $(IN \vee \overline{OUT})'$ and "$\wedge$" designates a boolean AND operation and "$\vee$" designates a boolean OR operation.

Referring now specifically to FIG. 12B, an alternative pull-down portion of a non-inverting output buffer according to a ninth embodiment of the present invention includes a control circuit 82' that is similar to the control circuit 82 of FIG. 12A, however, it is not responsive to an output enable signal OE and, therefore, is continuously responsive to changes in the input signal IN. Accordingly, the two-input NOR gate NOR15 of FIG. 12A is replaced by an inverter INV18 and the three-input NOR gate NOR14 of FIG. 12A is replaced by a two-input NOR gate NOR16.

Figure 13A:
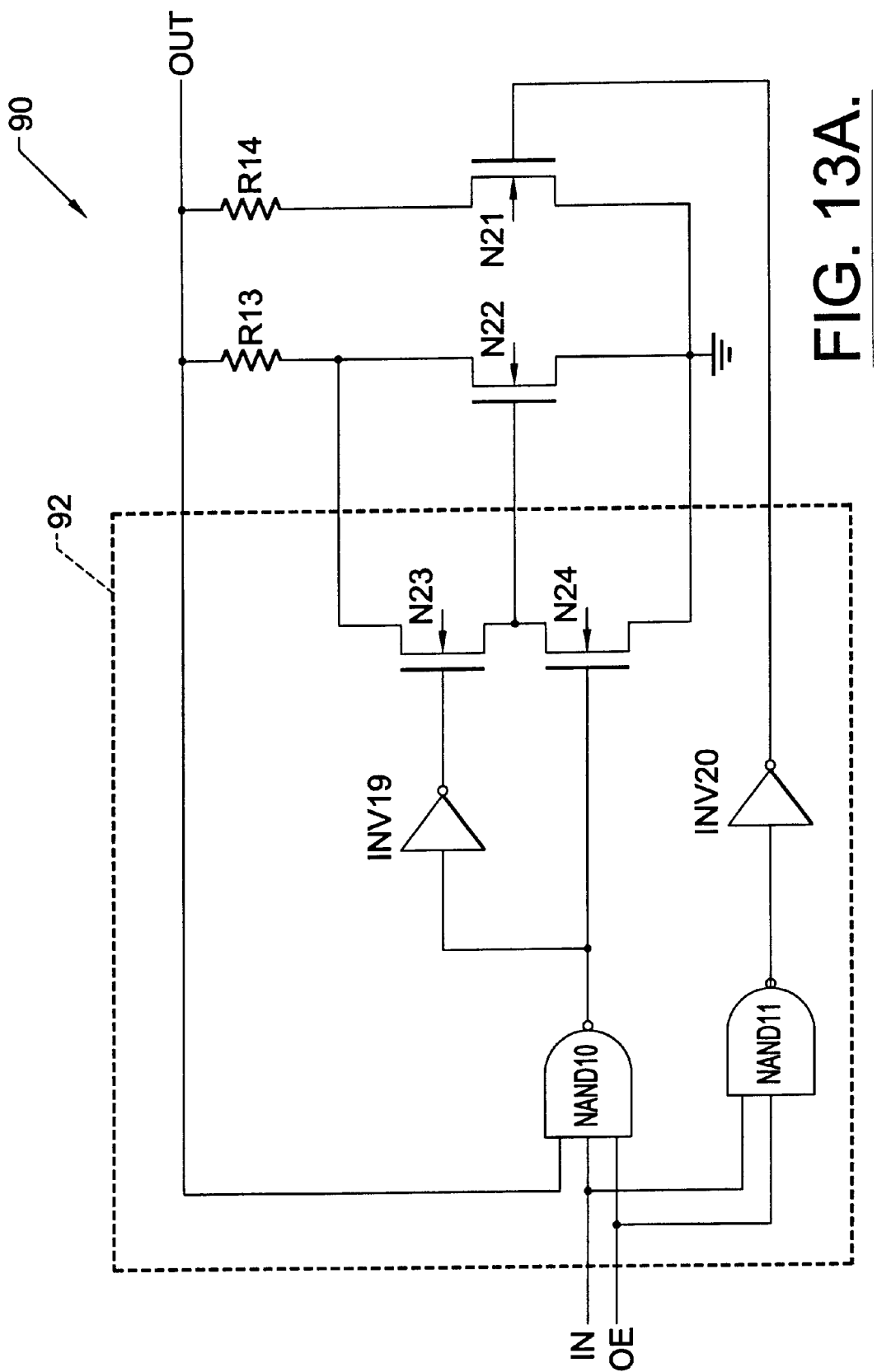
FIG. 13A is an electrical schematic of a pull-down portion of an inverting output buffer according to a tenth embodiment of the present invention.
Figure 13B:
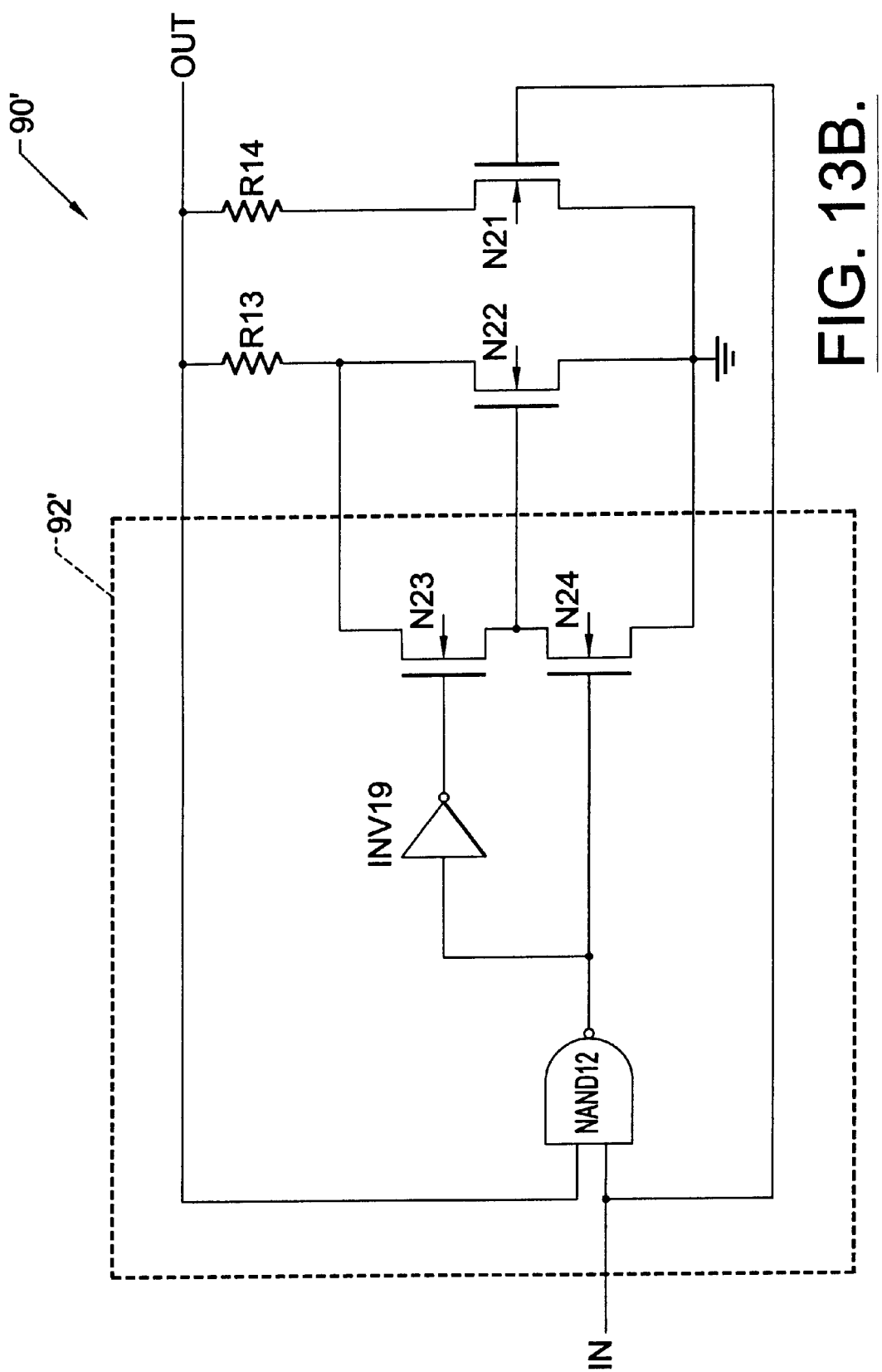
FIG. 13B is an alternative electrical schematic of a pull-down portion of an inverting output buffer according to the tenth embodiment of the present invention.

Referring now to FIGS. 13A–13B, integrated circuit output buffers 90 and 90' according to tenth embodiments of the present invention will be described. In particular, FIG. 13A illustrates a preferred pull-down portion of an inverting output buffer that also includes primary and secondary NMOS pull-down transistors N21 and N22 and an output signal line OUT that is electrically coupled to the drains of the NMOS pull-down transistors N21 and N22 by resistors R14 and R13, respectively. The control circuit 92 is also provided so that, when enabled (i.e., OE=1), the receipt of a logic 1 input signal IN (when OE=1 and OUT=1) will cause the output signal line OUT to be pulled from a logic 1 potential to a logic 0 potential during a pull-down time interval. In particular, the receipt of a logic 1 input signal IN will cause the output of the three-input NAND gate NAND10 to generate a logic 0 signal. This logic 0 signal will cause the NMOS gate pull-down transistor N24 to turn off and cause the gate control inverter INV19 to generate a logic 1 signal. The generation of a logic 1 signal by the gate control inverter INV19 will turn on the NMOS gate pull-up transistor N23 at the commencement of the pull-down time interval and during the first portion thereof. However, once the output signal line OUT has been pulled down to a logic 0 level, the output of the three-input NAND gate NAND10 will switch to a logic 1 potential. This 0→1 transition at the output of the NAND gate NAND10 will operate to turn off the NMOS gate pull-up transistor N23 and turn on the NMOS gate pull-down transistor N24. This transition will also turn off the secondary NMOS pull-down transistor N22 during the second portion of the pull-down time interval. Nonetheless, the primary NMOS pull-down transistor N21 will remain conductive during both the first and second consecutive portions of the pull-down time interval since it receives a logic 1 gate signal whenever IN∧OE=1. Here, the two-input NAND gate NAND11 and the inverter INV20 collectively perform a boolean AND operation. Accordingly, when the output enable signal OE is set to a logic 1 level (or when an OE input is not provided as shown in FIG. 13B) the control circuit 92 provides the gate of the primary pull-down transistor N21 with a first gate signal that tracks IN, and provides a gate of the gate pull-up transistor N23 with a second gate signal that is a function of IN∧OUT. The output buffer 90' of FIG. 13B is similar to the buffer 90 of FIG. 13A, however, the control circuit 92' is not responsive to an output enable signal OE. Thus, the gate of the primary NMOS pull-down transistor N21 is directly responsive to the input signal IN, as illustrated.

Figure 14:
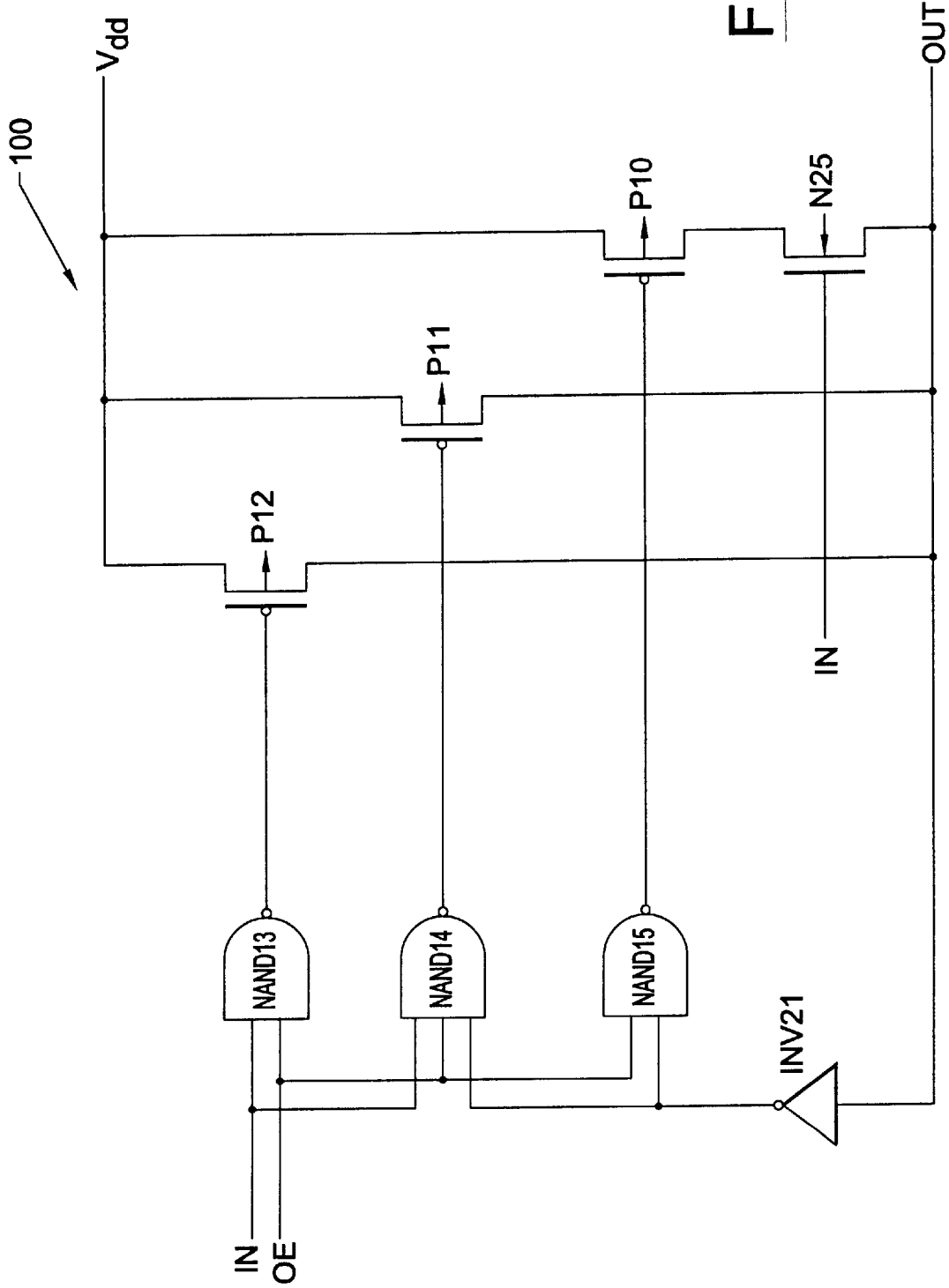
FIG. 14 is an electrical schematic of a pull-up portion of a non-inverting output buffer according to an eleventh embodiment of the present invention.

Referring now to FIG. 14, a preferred pull-up portion of a non-inverting output buffer 100 according to an eleventh embodiment of the present invention will be described. This pull-up portion may be combined with the pull-down portion illustrated by FIG. 12A to provide an output buffer having pull-down and pull-up capability. In particular, the pull-up portion illustrated by FIG. 14 includes a plurality of PMOS pull-up transistors P10, P11 and P12. This PMOS pull-up transistor P10 will typically be conductive prior to commencement of a pull-up time interval (when OUT=0 and OE=1 and the output of NAND gate NAND15 is maintained at a logic 1 level). An NMOS transistor N25 is also provided between a drain of PMOS pull-up transistor P10 and the output signal line OUT. This NMOS transistor N25 has a gate that receives an input signal IN. Accordingly, the NMOS transistor N25 immediately becomes conductive when the input signal IN is driven to a logic 1 potential. Thus, the pull-up path provided by NMOS transistor N25 and PMOS pull-up transistor P10 will typically become conductive prior to the pull-up paths provided by PMOS transistors P11 and P12 and may provide a degree of phased turn-on to the pull-up portion that may help reduce Vdd ringing. The NMOS transistor N25 will automatically turn off when Vdd−Vth=Vout, where Vth is the threshold voltage of the NMOS transistors N25.

The gates of the PMOS pull-up transistors P10, P11 and P12 are responsive to the outputs of their respective NAND gates. For example, the gate of PMOS pull-up transistor P12 is responsive to the output of a two-input NAND gate NAND13, the gate of PMOS pull-up transistor P11 is responsive to the output of a three-input NAND gate NAND14 and the gate of PMOS pull-up transistor P10 is responsive to the output of a two-input NAND gate NAND15. A feedback inverter INV21 is also provided so that an inverted version of the fed back output signal OUT can be provided as an input to a pair of NAND gates NAND14 and NAND15. If the trip point of this feedback inverter INV21 does not need to be made too high, then PMOS transistor P11, which provides extra pull-up current when NMOS transistor N12 is either at or near turn off, may not be necessary. However, it is typically preferable to have the trip point of INV21 set above Vdd/2 and the trip point of INV16 illustrated by FIG. 12A set below Vdd/2 to increase the speed of the illustrated output buffers (by delaying turn-off the secondary pull-up and pull-down transistors during respective pull-up and pull-down time intervals).

Based on this configuration of the preferred pull-up portion of the non-inverting output buffer 100, the receipt of a logic 1 input signal IN and a logic 1 output enable signal OE will cause the output of NAND13 to generate a logic 0 signal and turn on PMOS pull-up transistor P12 as the primary pull-up transistor during first and second consecutive portions of the pull-up time interval. Moreover, when the output signal line OUT is at a logic 0 level, the receipt of a logic 1 input signal IN and a logic 1 output enable signal OE will cause the output of NAND14 to generate a logic 0 signal and turn on PMOS pull-up transistor P11 during the first portion of the pull-up time interval. As described above, the receipt of a logic 1 output enable signal OE while the output signal line OUT is at a logic 0 level will also cause the output of NAND15 to generate a logic 0 signal and turn on PMOS pull-up transistor P10. However, the pull-up path provided by the PMOS pull-up transistor P10 will not operate to pull up the output signal line OUT unless NMOS transistor N25 turns on in response to a logic 1 input signal IN. Thus, at the commencement of a pull-up time interval and during the first portion thereof (when the potential of the output signal OUT is at a logic 0 level), PMOS pull-up transistors P10, P11 and P12 and NMOS transistor N25 will all turn on so that the rate at which the output signal OUT transitions from a logic 0 level to a minimum threshold logic 1 level will be high. Then, once the output signal OUT transitions through a minimum threshold logic 1 level, the output of the feed back inverter INV21 will transition from 1→0 and the outputs of NAND gates NAND15 and NAND14 will transition from 0→1 to thereby turn off PMOS transistors P11 and P10 at the commencement of the second portion of the pull-up time interval. Here, the duration of the pull-up time interval associated with the output signal line OUT is typically substantially longer (because of higher loading) than the combined delay associated with the feedback inverter INV21 and the delay of either the three-input NAND gate NAND14 or the two-input NAND gate NAND15. The turn off of PMOS transistors P10 and P11 at the commencement of the second portion of the pull-up time interval will operate to slow the rate of pull-up of the output signal line OUT at the tail end of the pull-up time interval. Replacement of the NAND gates NAND13, NAND14 and NAND15 of FIG. 14 by an inverter, a two-input NAND gate and an inverter, respectively, will also enable the pull-up circuit to be used with the pull-down circuit of FIG. 12B.

Figure 15A:
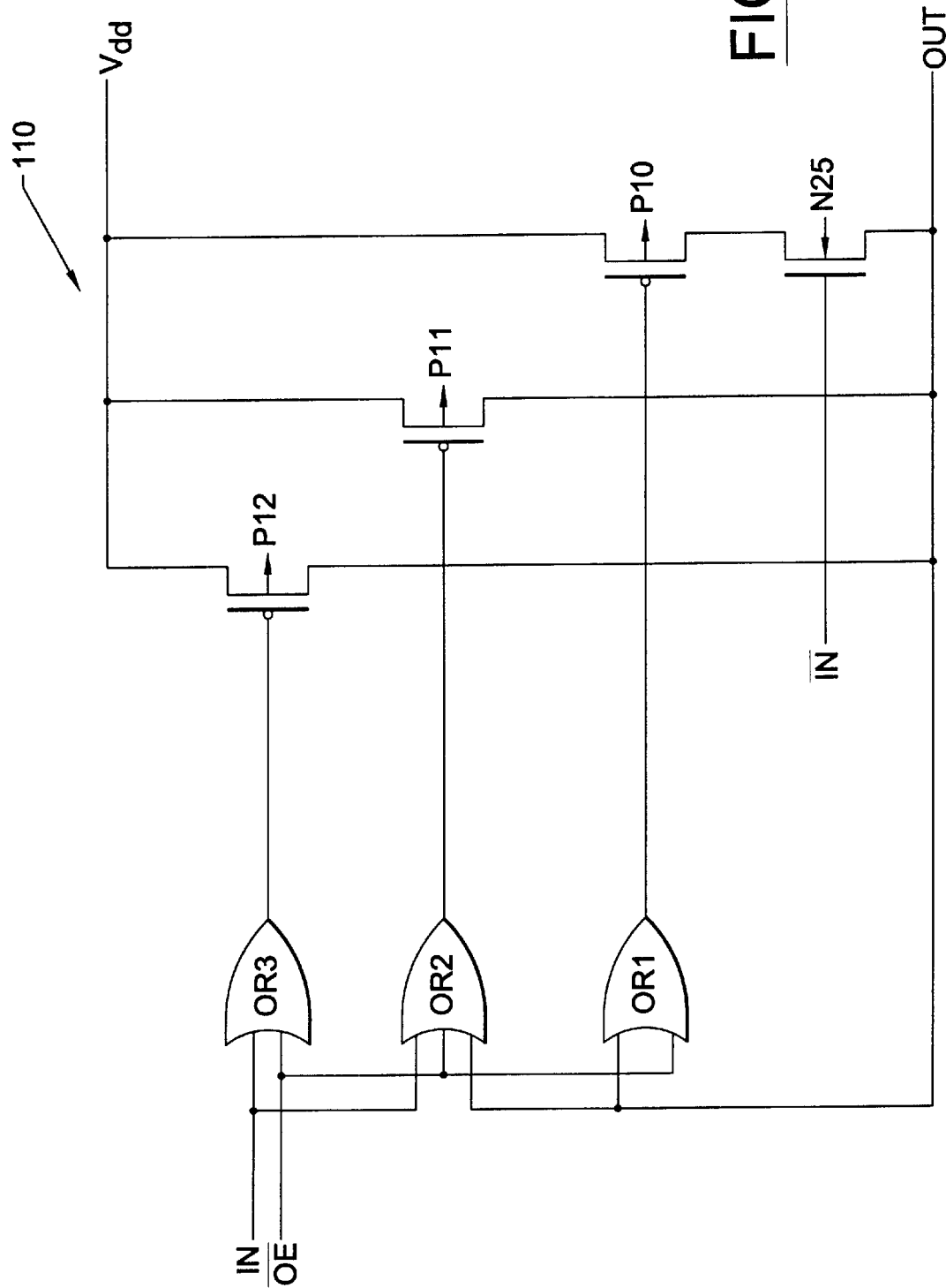
FIG. 15A is an electrical schematic of a pull-up portion of an inverting output buffer according to a twelfth embodiment of the present invention.
Figure 15B:
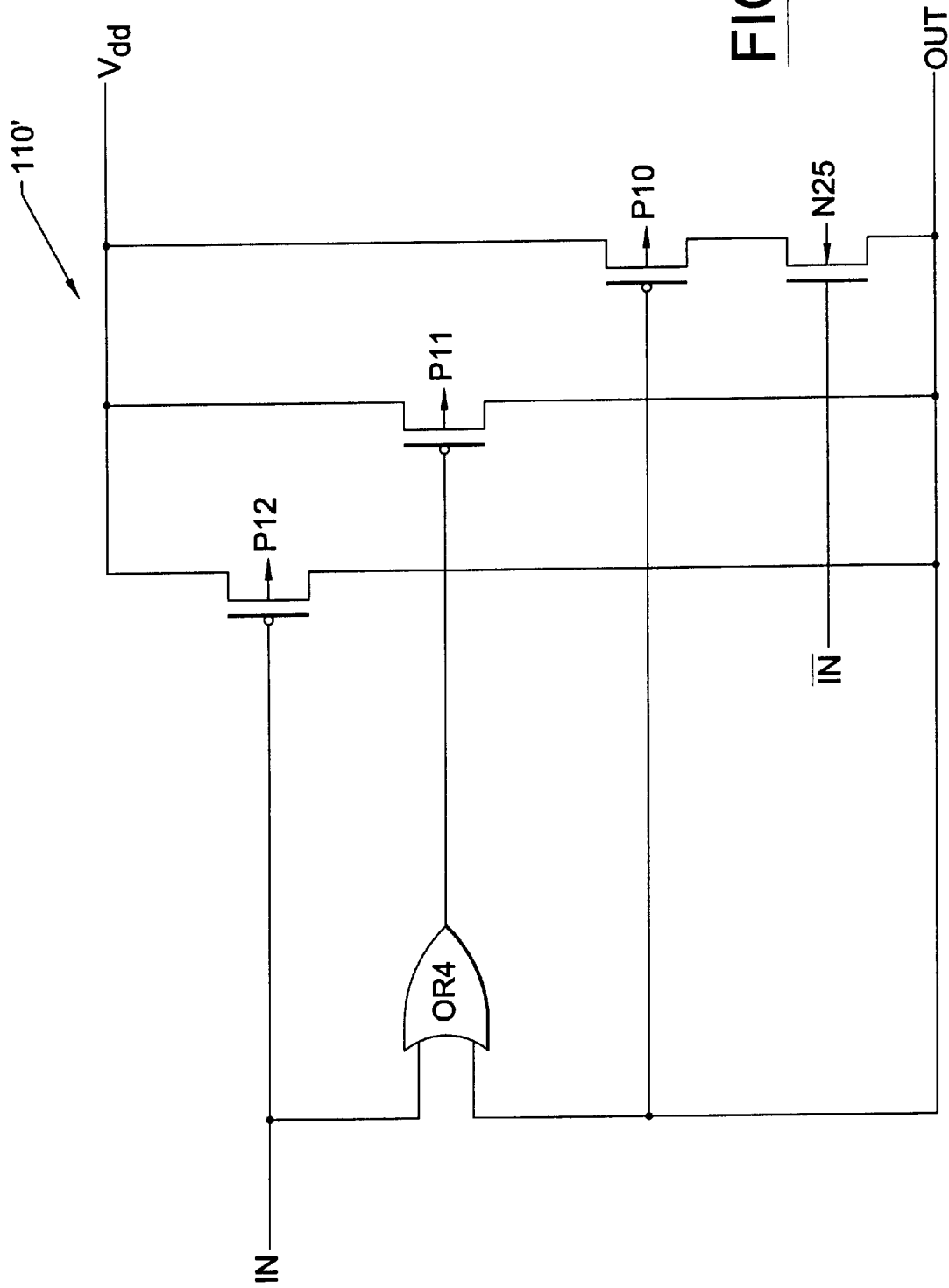
FIG. 15B is an alternative electrical schematic of a pull-up portion of an inverting output buffer according to the twelfth embodiment of the present invention.

Referring now to FIGS. 15A–15B, preferred pull-up portions of inverting output buffers 110 and 110' according to a twelfth embodiment of the present invention will be described. These pull-up portions may be combined with the pull-down portions illustrated by FIGS. 13A–13B to provide an output buffer having pull-down and pull-up capability. In particular, by substituting OR gates for the NAND gates of FIG. 14 and by setting the gate of the NMOS transistor N25 responsive to an inverted input signal (i.e., $\overline{IN}$), the circuit of FIG. 14 can be converted into a pull-up portion of an inverting output buffer which is responsive to complementary output enable signal $\overline{OE}$. The pull-up portion of an inverting output buffer 110' illustrated by FIG. 15B is similar to the pull-up portion of FIG. 15A, however, the output buffer is not influenced by the value of an output enable signal.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit output buffer, comprising:

first and second MOS transistors;

an output signal line electrically coupled to a drain of said first MOS transistor and a drain of said second MOS transistor;

a first gate control transistor having a source electrically connected to a source of said second MOS transistor and a drain electrically connected to a gate of said second MOS transistor;

a second gate control transistor having a source electrically connected to the gate of said second MOS transistor and a drain electrically connected to the drain of said second MOS transistor; and a control circuit that is responsive to an input signal and an output signal on the output signal line and selectively turns on said first gate control transistor and said second gate control transistor during consecutive non-overlapping portions of a pull-down/pull-up time interval.

2. An integrated circuit output buffer, comprising:

first and second pull-down transistors;

an output signal line electrically coupled to a drain of said first pull-down transistor and a drain of said second pull-down transistor; and a control circuit that turns on said first pull-down transistor during first and second consecutive portions of a pull-down time interval and uses a signal fed back from said output signal line to electrically connect a gate electrode of said second pull-down transistor to a drain of said second pull-down transistor during the first portion of the pull-down time interval and electrically connect the gate electrode of said second pull-down transistor to a source of said second pull-down transistor during the second portion of the pull-down time interval, said control circuit comprising:
  a gate pull-up transistor having a drain electrically connected to the drain of said second pull-down transistor and a source electrically connected to a gate of said second pull-down transistor; and
  a gate pull-down transistor having a drain electrically connected to the gate of said second pull-down transistor and a source electrically connected to a source of said second pull-down transistor.

3. The output buffer of claim 2, wherein said control circuit comprises a gate control inverter having an input electrically coupled to a gate of said gate pull-up transistor and an output electrically coupled to a gate of said gate pull-down transistor.

4. The output buffer of claim 2, wherein said control circuit comprises a gate control inverter having an input electrically coupled to a gate of said gate pull-down transistor and an output electrically coupled to a gate of said gate pull-up transistor.

5. The output buffer of claim 3, wherein said control circuit comprises:
  a feedback inverter having an input electrically coupled to said output signal line; and
  a first logic gate having a first input electrically coupled to an output of said feedback inverter and an output electrically coupled to the input of said gate control inverter.

6. The output buffer of claim 4, wherein said control circuit comprises:
  a feedback inverter having an input electrically coupled to said output signal line; and
  a first logic gate having a first input electrically coupled to an output of said feedback inverter and an output electrically coupled to the input of said gate control inverter.

7. The output buffer of claim 5, wherein said first logic gate comprises a NOR gate.

8. The output buffer of claim 6, wherein said control circuit comprises a second logic gate having a first input responsive to an input signal and an output electrically connected to a gate electrode of said first pull-down transistor.

9. The output buffer of claim 8, wherein a second input of said first logic gate is electrically connected to the first input of said second logic gate; and wherein said first and second logic gates comprise first and second NOR gates, respectively.

10. An integrated circuit output buffer, comprising:
  first and second pull-down transistors;
  first and second pull-up transistors;
  an output signal line electrically coupled to drains of said first and second pull-down transistors and said first and second pull-up transistors; and
  a control circuit that turns on said first pull-down transistor during first and second consecutive portions of a pull-down time interval and uses a signal fed back from said output signal line to electrically connect a gate electrode of said second pull-down transistor to a drain of said second pull-down transistor during the first portion of the pull-down time interval and electrically connect the gate electrode of said second pull-down transistor to a source of said second pull-down transistor during the second portion of the pull-down time interval.

11. An integrated circuit output buffer, comprising:
  first and second pull-down transistors;
  an output signal line electrically coupled to a drain of said first pull-down transistor and a drain of said second pull-down transistor;
  a gate pull-up transistor having a drain electrically connected to the drain of said second pull-down transistor and a source electrically connected to a gate of said second pull-down transistor;
  a gate pull-down transistor having a drain electrically connected to the gate of said second pull-down transistor and a source electrically connected to a source of said second pull-down transistor; and
  a control circuit that turns on said first pull-down transistor during first and second consecutive portions of a pull-down time interval and uses a signal fed back from said output signal line to turn on said second pull-down transistor during the first portion of the pull-down time interval by turning on said gate pull-up transistor during the first portion of the pull-down time interval and then turn off said second pull-down transistor during the second portion of the pull-down time interval by turning on said gate pull-down transistor during the second portion of the pull-down time interval.

12. The output buffer of claim 11, wherein said control circuit comprises a gate control inverter having an input electrically connected to a gate of said gate pull-up transistor and an output electrically connected to a gate of said gate pull-down transistor.

13. The output buffer of claim 12, wherein said control circuit comprises:
  a multi-input logic gate having a first input responsive to a true or complementary version of the fed back signal and an output electrically connected to the input of said gate control inverter.

14. An integrated circuit output buffer, comprising:
  first and second pull-down transistors;
  an output signal line electrically coupled to a drain of said first pull-down transistor and a drain of said second pull-down transistor;
  a gate pull-up transistor having a drain electrically connected to the drain of said second pull-down transistor and a source electrically connected to a gate of said second pull-down transistor;
  a gate pull-down transistor having a drain electrically connected to the gate of said second pull-down transistor and a source electrically connected to a source of said second pull-down transistor; and
  a control circuit responsive to an input signal (IN) and an output signal (OUT) fed back from said output signal line, said control circuit having logic devices therein that:
    provide a gate of said first pull-down transistor with a first gate signal that tracks $\overline{IN}$, and a gate of at least one of said gate pull-up transistor and said gate pull-down transistor with a second gate signal that is a function of $\overline{IN} \wedge OUT$; or provide a gate of said first pull-down transistor with a first gate signal that tracks IN, and a gate of at least one of said gate pull-up transistor and said gate pull-down transistor with a second gate signal that is a function of IN∧OUT.

15. The output buffer of claim 14, wherein the second gate signal is provided to the gate of said gate pull-up transistor; and wherein said control circuit provides the gate of said gate pull-down transistor with a third gate signal that is an inverted version of the second gate signal.

16. The output buffer of claim 14, wherein said control circuit is responsive to an output enable signal (OE); wherein said control circuit provides a gate of said first pull-down transistor with a first gate signal that tracks $\overline{\text{IN}}$ only when OE is in a first logic state.

17. The output buffer of claim 16, wherein the second gate signal is a function of $\overline{\text{IN}}$∧OUT∧OE.

18. An integrated circuit output buffer, comprising:
   first and second pull-down transistors;
   an output signal line electrically coupled to a drain of said first pull-down transistor and a drain of said second pull-down transistor; and
   a control circuit that turns on said first pull-down transistor during first and second consecutive portions of a pull-down time interval and uses a signal fed back from said output signal line to electrically connect a gate electrode of said second pull-down transistor to a drain of said second pull-down transistor during the first portion of the pull-down time interval and electrically connect the gate electrode of said second pull-down transistor to a source of said second pull-down transistor during the second portion of the pull-down time interval.

19. The output buffer of claim 18, wherein the source of said second pull-down transistor is electrically connected to a source of said first pull-down transistor and to a ground signal line.

20. An integrated circuit output buffer, comprising:
   first and second pull-down transistors;
   first and second pull-up transistors;
   an output signal line electrically coupled to drains of said first and second pull-down transistors and said first and second pull-up transistors;
   a control circuit that turns on said first pull-down transistor during first and second consecutive portions of a pull-down time interval and uses a signal fed back from said output signal line to electrically connect a gate electrode of said second pull-down transistor to a drain of said second pull-down transistor during the first portion of the pull-down time interval and electrically connect the gate electrode of said second pull-down transistor to a source of said second pull-down transistor during the second portion of the pull-down time interval;
   a third PMOS pull-up transistor; and
   an NMOS pass transistor electrically connected in series between a drain of said third PMOS pull-up transistor and said output signal line.

21. The output buffer of claim 20, wherein said control circuit comprises:
   a first logic gate having an output electrically connected to a gate of said first pull-up transistor;
   a second logic gate having an output electrically connected to a gate of said second pull-up transistor; and
   a third logic gate having an output electrically connected to a gate of said third PMOS pull-up transistor.

22. The output buffer of claim 21, wherein said NMOS pass transistor has a gate responsive to an input signal.

23. The output buffer of claim 22, further comprising an inverter having an input electrically connected to said output signal line and an output electrically connected to inputs of said second and third logic gates.

24. The output buffer of claim 23, wherein said first logic gate comprises a two-input logic gate; wherein said second logic gate comprises a three-input logic gate and wherein said third logic gate comprises a two-input logic gate.

25. The output buffer of claim 22, wherein said third logic gate is not responsive to the input signal.

26. The output buffer of claim 25, wherein said first, second and third logic gates comprise NAND logic gates.

27. The output buffer of claim 20, wherein said control circuit comprises:
   a gate pull-up transistor having a drain electrically connected to the drain of said second pull-down transistor and a source electrically connected to a gate of said second pull-down transistor; and
   a gate pull-down transistor having a drain electrically connected to the gate of said second pull-down transistor and a source electrically connected to a source of said second pull-down transistor.

28. The output buffer of claim 22, wherein said control circuit comprises:
   a gate pull-up transistor having a drain electrically connected to the drain of said second pull-down transistor and a source electrically connected to a gate of said second pull-down transistor; and
   a gate pull-down transistor having a drain electrically connected to the gate of said second pull-down transistor and a source electrically connected to a source of said second pull-down transistor.

29. The output buffer of claim 28, wherein said control circuit comprises a gate control inverter having an input electrically coupled to a gate of said gate pull-up transistor and an output electrically coupled to a gate of said gate pull-down transistor.

30. The output buffer of claim 27, wherein said control circuit comprises a gate control inverter having an input electrically coupled to a gate of said gate pull-down transistor and an output electrically coupled to a gate of said gate pull-up transistor.

31. The output buffer of claim 29, wherein said control circuit comprises:
   a feedback inverter having an input electrically coupled to said output signal line; and
   a fourth logic gate having a first input electrically coupled to an output of said feedback inverter and an output electrically coupled to the input of said gate control inverter.

32. The output buffer of claim 30, wherein said control circuit comprises:
   a feedback inverter having an input electrically coupled to said output signal line; and
   a fourth logic gate having a first input electrically coupled to an output of said feedback inverter and an output electrically coupled to the input of said gate control inverter.

33. The output buffer of claim 32, wherein said fourth logic gate comprises a NOR gate; and wherein said first logic gate comprises a NAND logic gate.

34. The output buffer of claim 32, wherein said control circuit comprises a fifth logic gate having a first input responsive to an input signal and an output electrically connected to a gate electrode of said first pull-down transistor.

35. The output buffer of claim 34, wherein a second input of said fourth logic gate is electrically connected to the first input of said fifth logic gate; and wherein said fourth and fifth logic gates comprise NOR gates.

36. An integrated circuit output buffer, comprising:

first and second NMOS pull-down transistors;

first, second and third PMOS pull-up transistors;

an output signal line electrically coupled to drains of said first and second NMOS pull-down transistors and said first and second PMOS pull-up transistors;

an NMOS pass transistor that is electrically connected in series between said output signal line and a drain of said third PMOS pull-up transistor and is responsive to an input signal;

a gate pull-up transistor having a drain electrically connected to the drain of said second NMOS pull-down transistor and a source electrically connected to a gate of said second NMOS pull-down transistor;

a gate pull-down transistor having a drain electrically connected to the gate of said second NMOS pull-down transistor and a source electrically connected to a source of said second NMOS pull-down transistor; and a control circuit that turns on said first, second and third PMOS pull-up transistors during a first portion of a pull-up time interval and uses a signal fed back from said output signal line to turn off said second and third PMOS pull-up transistors during a second portion of the pull-up time interval and that turns on said first and second NMOS pull-down transistors during a first portion of a pull-down time interval and uses the signal fed back from said output signal line to turn off said second NMOS pull-down transistor during a second portion of the pull-down time interval.

37. The output buffer of claim 36, wherein the turn off of said second and third PMOS pull-up transistors during the second portion of the pull-up time interval is in-sync with a transition of an output signal on said output signal line from a first logic state to a second logic state; and wherein the turn off of said second NMOS pull-down transistor during the second portion of the pull-down time interval is in-sync with a transition of the output signal from the second logic state to the first logic state.

38. The output buffer of claim 37, wherein said control circuit comprises a gate control inverter having an input electrically connected to a gate of said gate pull-up transistor and an output electrically coupled to a gate of said gate pull-down transistor; wherein said gate pull-up transistor is on during the first portion of the pull-down time interval; and wherein said gate pull-down transistor is on during the second portion of the pull-down time interval.

* * * * *